(12) United States Patent
Simsek-Ege et al.

(10) Patent No.: US 11,476,262 B2
(45) Date of Patent: Oct. 18, 2022

(54) METHODS OF FORMING AN ARRAY OF CAPACITORS

(71) Applicant: Micron Technology, Inc., Boise, ID (US)

(72) Inventors: Fatma Arzum Simsek-Ege, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/941,174

(22) Filed: Jul. 28, 2020

(65) Prior Publication Data
US 2022/0037342 A1 Feb. 3, 2022

(51) Int. Cl.
*H01L 27/11507* (2017.01)
*H01L 27/11504* (2017.01)
(Continued)

(52) U.S. Cl.
CPC .... *H01L 27/11507* (2013.01); *H01L 21/7688* (2013.01); *H01L 27/10814* (2013.01);
(Continued)

(58) Field of Classification Search
CPC ........... H01L 21/76877; H01L 21/7688; H01L 27/10808; H01L 27/10814;
(Continued)

(56) References Cited

U.S. PATENT DOCUMENTS 10,403,631 B1 * 9/2019 Lu .................. G11C 11/221
2004/0047174 A1 3/2004 Chen et al.
(Continued)

FOREIGN PATENT DOCUMENTS

| KR | 10-2019-0038673 | 4/2019 |
| WO | WO 02/025667 | 3/2002 |
| WO | WO PCT/US2021/041940 | 11/2021 |

*Primary Examiner* — Herve-Louis Y Assouman
*Assistant Examiner* — Christopher M Roland
(74) *Attorney, Agent, or Firm* — Wells St. John P.S.

(57) ABSTRACT

A method of forming an array of capacitors comprises forming rows and columns of horizontally-spaced openings in a sacrificial material. Fill material is formed in multiple of the columns of the openings and lower capacitor electrodes a are formed in a plurality of the columns that are between the columns of the openings comprising the fill material therein. The fill material is of different composition from that of the lower capacitor electrodes. The fill material is between a plurality of horizontally-spaced groups that individually comprises the lower capacitor electrodes. Immediately-adjacent of the groups are horizontally spaced apart from one another by a gap that comprises at least one of the columns of the openings comprising the fill material therein. The sacrificial material is removed to expose laterally-outer sides of the lower capacitor electrodes. A capacitor insulator is formed over tops and the laterally-outer sides of the lower capacitor electrodes. Upper capacitor electrode material is formed over the capacitor insulator and the lower capacitor electrodes. A horizontally-elongated conductive line is formed atop individual of the groups that directly electrically couple together the upper capacitor electrode material there-below in that individual group.

15 Claims, 34 Drawing Sheets

(51) Int. Cl.
    *H01L 21/768*    (2006.01)
    *H01L 49/02*     (2006.01)
    *H01L 27/108*    (2006.01)

(52) U.S. Cl.
    CPC .. *H01L 27/10855* (2013.01); *H01L 27/11504* (2013.01); *H01L 28/55* (2013.01)

(58) Field of Classification Search
    CPC ......... H01L 27/10844; H01L 27/10847; H01L 27/1085; H01L 27/10852; H01L 27/10855; H01L 27/115; H01L 27/11502; H01L 27/11504; H01L 27/11507; H01L 28/55
    See application file for complete search history.

(56)            References Cited

U.S. PATENT DOCUMENTS

2008/0283816 A1* 11/2008 Takaishi .................. H01L 27/24
                                                          257/4
2018/0061468 A1    3/2018  Derner et al.
2018/0122816 A1    5/2018  Ramaswamy
2020/0203357 A1    6/2020  Chhajed et al.
2020/0235111 A1    7/2020  Calderoni et al.

* cited by examiner

METHODS OF FORMING AN ARRAY OF CAPACITORS

TECHNICAL FIELD

Embodiments disclosed herein pertain to arrays of capacitors, to arrays of memory cells, to methods of forming an array of capacitors, and to methods of forming an array of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

DETAILED DESCRIPTION OF EXAMPLE EMBODIMENTS

Figure 1:
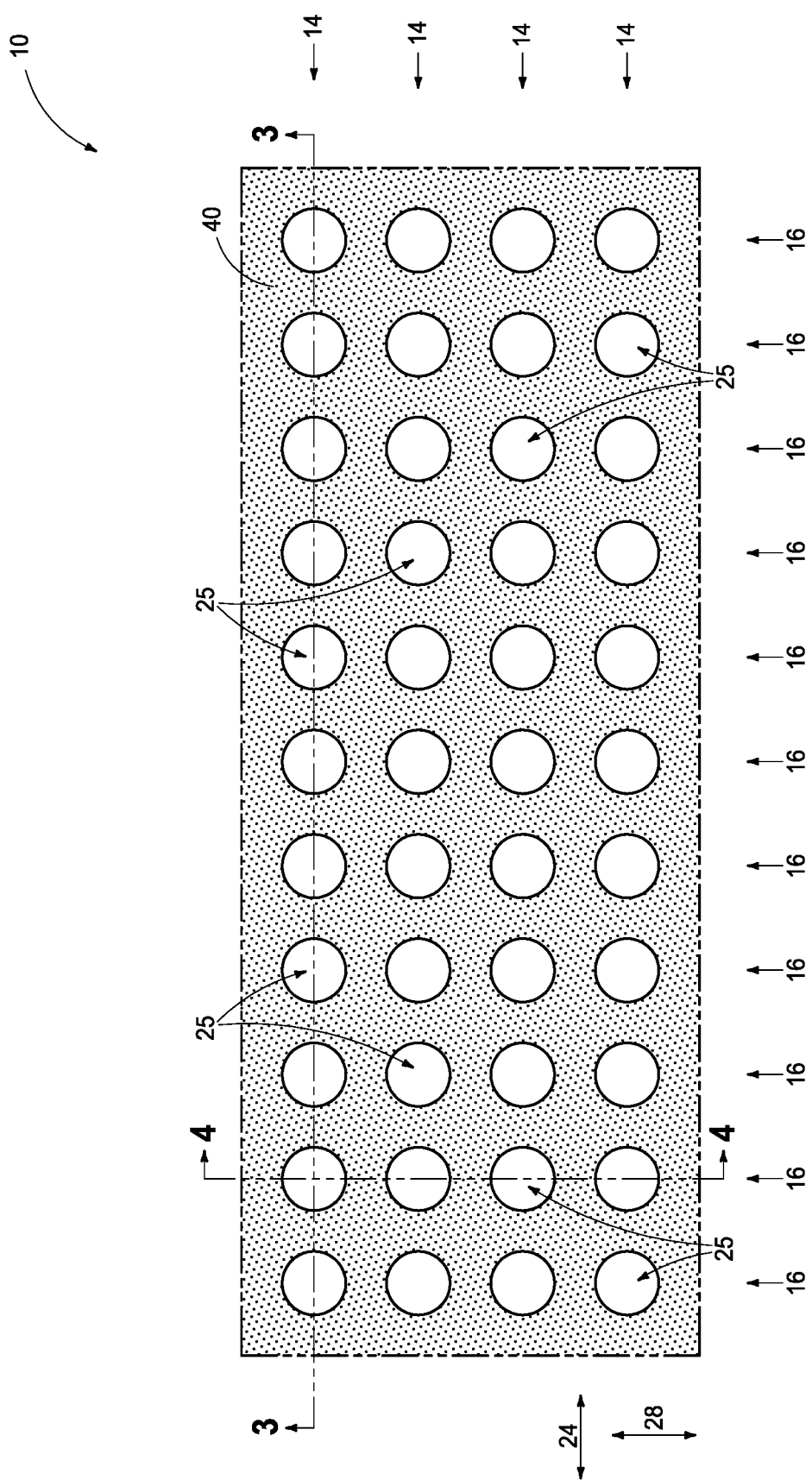
FIG. 1 is a diagrammatic cross-sectional view of a portion of a construction in process in accordance with some embodiments of the invention and is taken through line 1-1 in FIG. 3.
Figure 2:
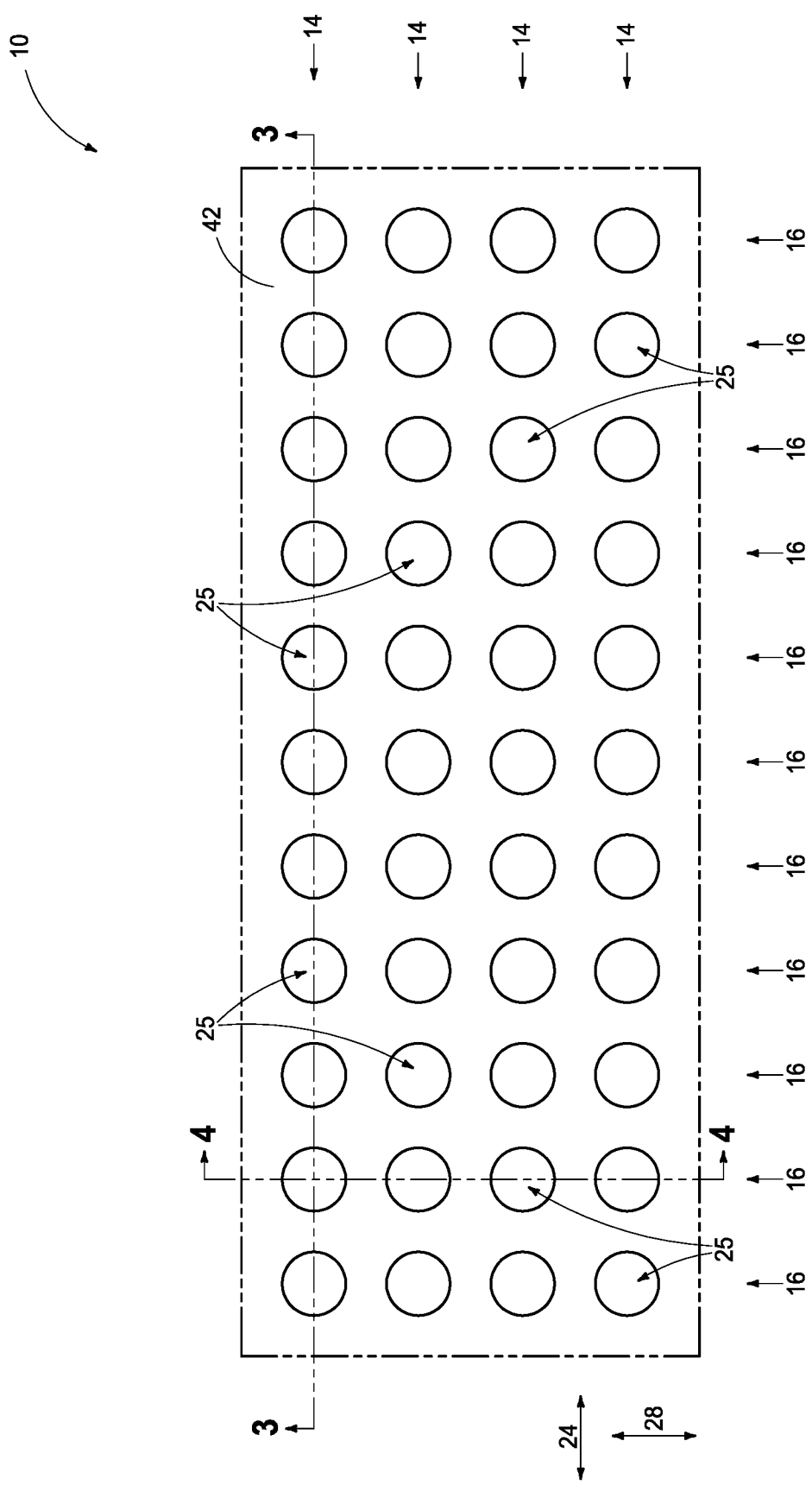
FIGS. 2-4 are cross-sectional views as taken through one or more of FIGS. 1-4 as indicated.
Figure 3:
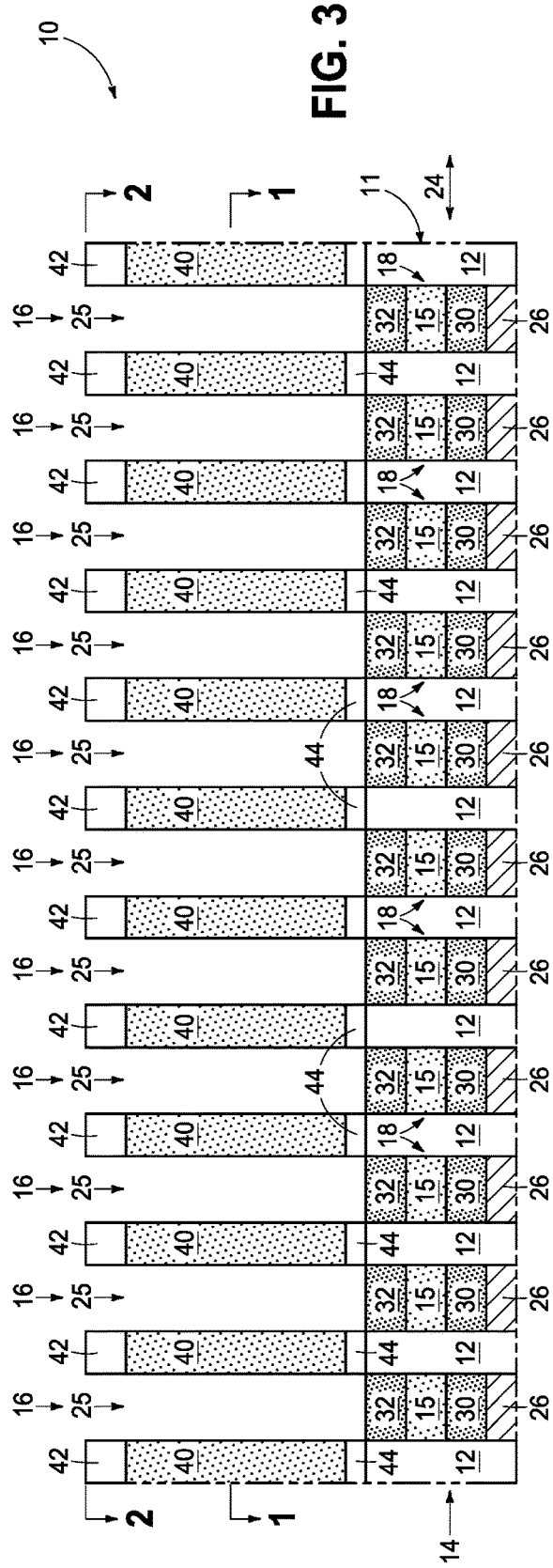
Figure 4:
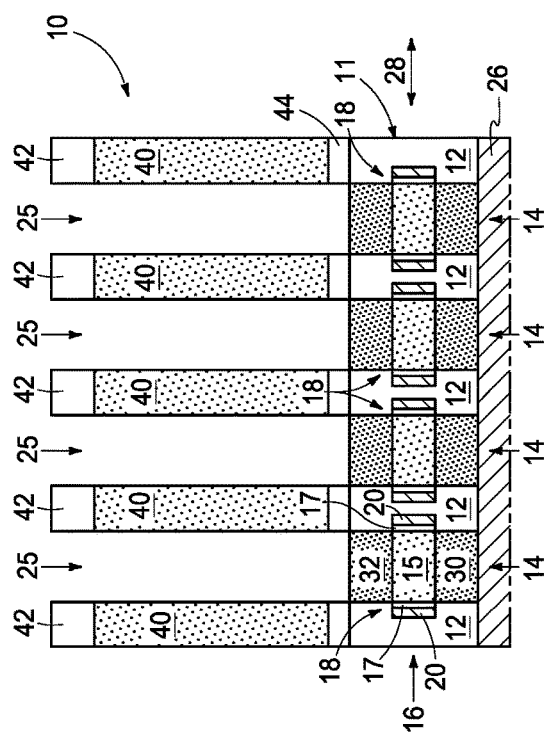

Embodiments of the invention encompass arrays of capacitors, arrays of memory cells, methods of forming an array of capacitors, and methods of forming an array of memory cells. Example method embodiments are initially described with reference to FIGS. 1-29.

Referring to FIGS. 1-4, such show a portion of a substrate construction 10 comprising a base substrate 11 comprising any one or more of conductive/conductor/conducting, semi-conductive/semiconductor/semiconducting, and insulative/insulator/insulating (i.e., electrically herein) materials. Various materials have been formed elevationally over and within base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11. Control and/or other peripheral circuitry for operating components within an array of capacitors and/or memory cells may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Rows 14 and columns 16 of transistors 18, which in one embodiment are vertical transistors, have been formed relative to or within substrate 11. A gateline 20 (FIG. 4) interconnects multiple of transistors 18 along individual rows 14 in a row direction 24. In the example embodiment, gatelines 20 are individually shown formed as a pair of lines running on opposite sides of a channel region 15 of individual transistors 18, with a gate insulator 17 being between channel regions 15 and conductive material of gatelines 20. Transistors 18 individually comprise a lower source/drain region 30 and an upper source/drain region 32. A digitline 26 interconnects multiple transistors 18 along individual columns 16 in a column direction 28. Individual lower source/drain regions 30 are directly electrically coupled with individual digitlines 26. Dielectric material 12 (e.g., silicon dioxide and/or silicon nitride) is shown surrounding transistors 18 and digitlines 26.

Rows (e.g., 14) and columns (e.g., 16) of horizontally-spaced openings 25 have been formed in substrate construction 10, for example in a material 40 (e.g., silicon dioxide or polysilicon) that in one embodiment is sacrificial. Individual openings 25 in one embodiment are directly above individual upper source/drain regions 32 of individual transistors 18. Example openings 25 are arrayed in horizontally-elongated rows (e.g., rows 14) in a row direction (e.g., 24) that is orthogonal to a column direction (e.g., 28). In one such embodiment and as shown, openings 25 are arrayed in a 2D Bravais lattice, and in one such embodiment which is rectangular or square. A material 44 (e.g., silicon nitride) and another material 42 (e.g., silicon nitride) are shown below and above material 40. Material 42 may serve as a bracing structure to facilitate maintaining lower capacitor electrodes (not yet shown) in openings in an upright manner during fabrication of the array of capacitors and/or memory cells. One or more additional layers (not shown) of bracing material 42 may be provided between the tops and bottoms of material 40.

Figure 5:
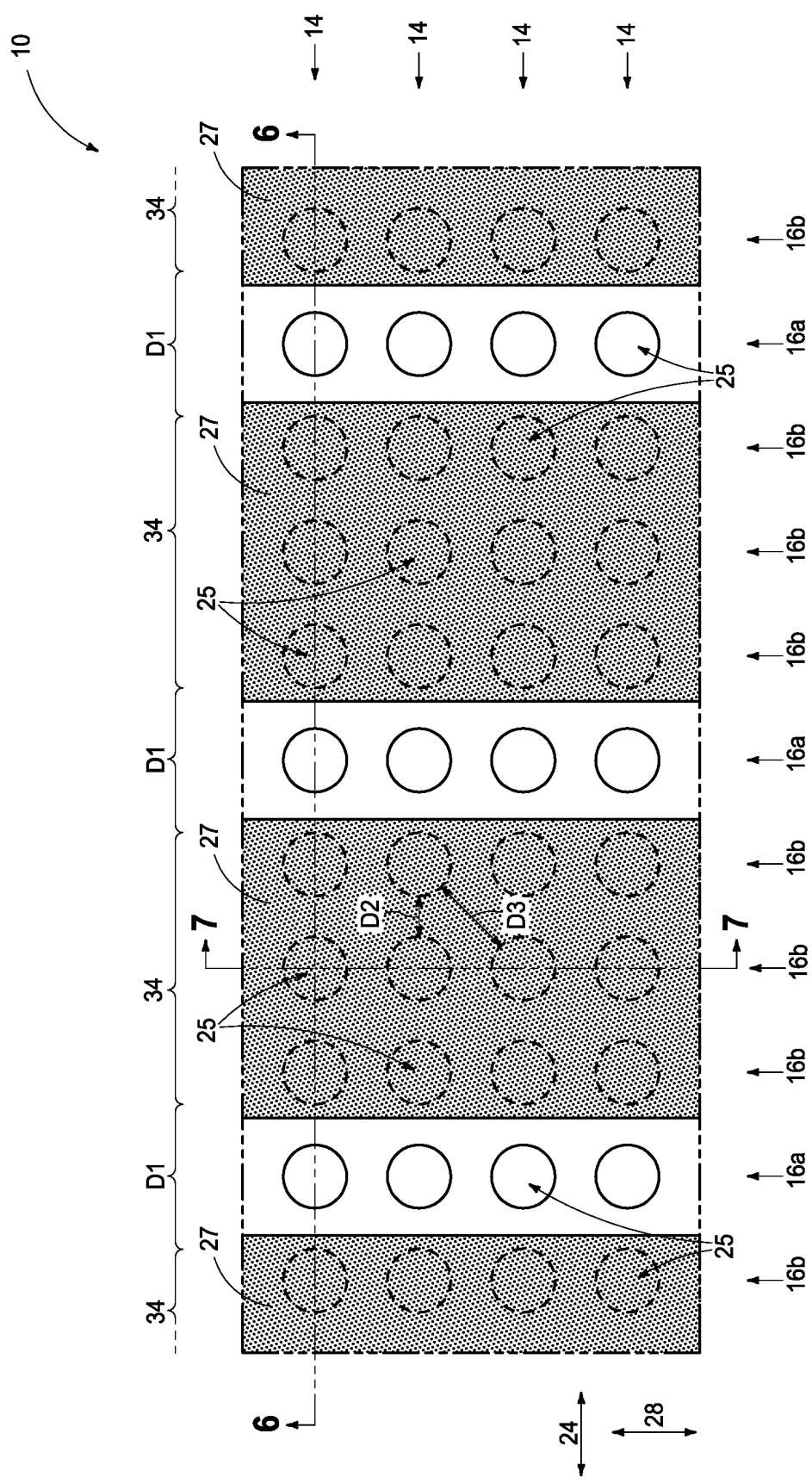
FIGS. 5-29 are diagrammatic sequential sectional, expanded, enlarged, and/or partial views of the construction of FIG. 1-4, or portions thereof, in process in accordance with some embodiments of the invention.
Figure 6:
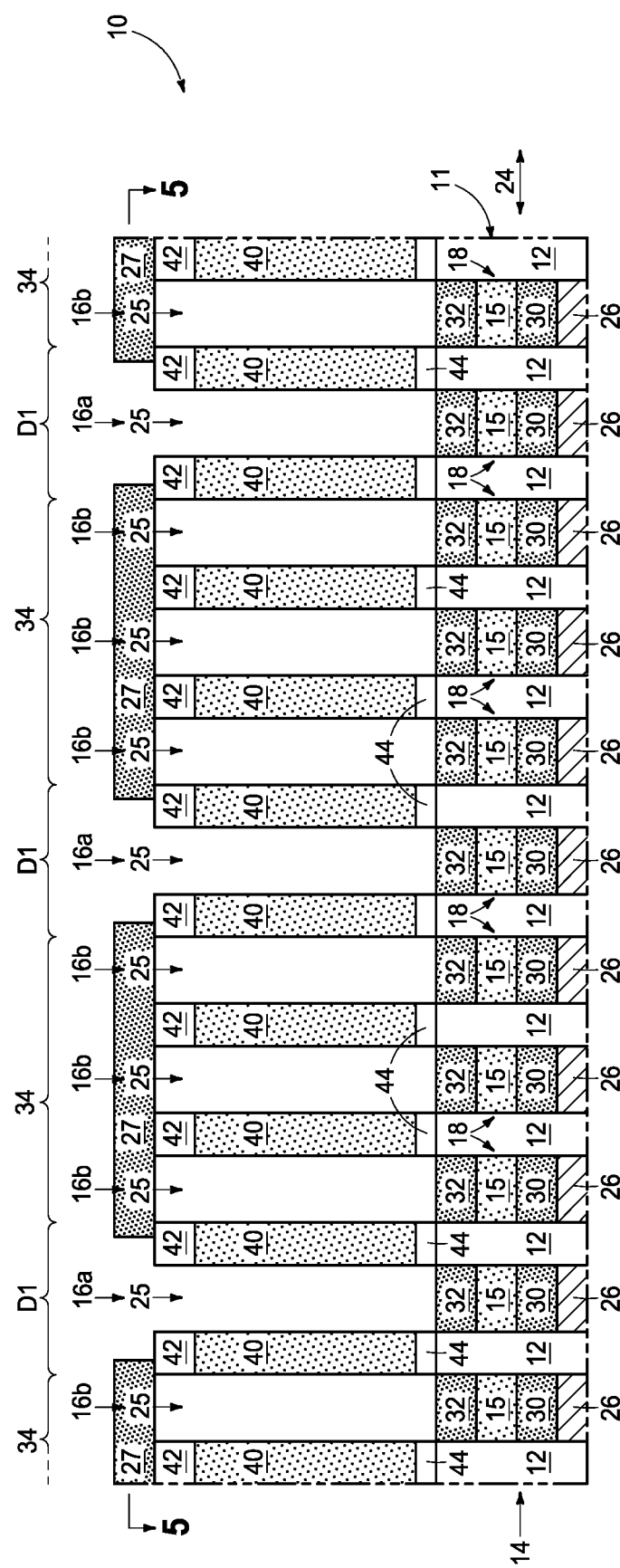
Figure 7:
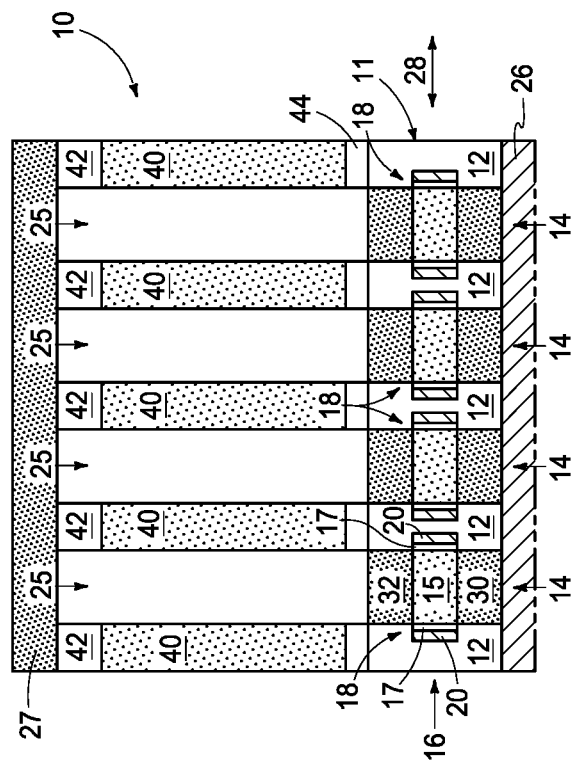

Referring to FIGS. 5-7, former columns 16 are now designated as 16a and 16b, with columns 16a hereafter considered as a multiple of columns and columns 16b considered as a plurality of columns. A non-conformal/low step coverage masking material 27 (e.g., carbon) has been formed atop material 42. Such has been patterned to leave multiple columns 16a of openings 25 exposed while covering (masking) plurality of columns 16b of openings 25 there-between. Such essentially defines a plurality of horizontally-spaced groups 34 individually comprising a plurality of openings 25. For brevity and ease of depiction, there are three columns 16b between each of immediately-adjacent exposed columns 16a. Further, the portions of groups 34 are individually shown as comprising twelve openings 25, although fewer or many more such openings 25 could be within an individual group 34 horizontally and/or vertically than is depicted on the sheet of FIGS. 5-7. Regardless, and in one embodiment, groups 34 are individually horizontally elongated, for example as shown in column direction 28. FIGS. 5-7 only show some of four example groups 34 although many more than four such groups would likely be formed. In one embodiment, immediately-adjacent groups 34 are horizontally spaced farther apart (e.g., dimension D1) than are closest-immediately-adjacent openings 25 within groups 34 (e.g., D1 compared to distances D2 and D3 in FIG. 5 considered individually).

Figure 8:
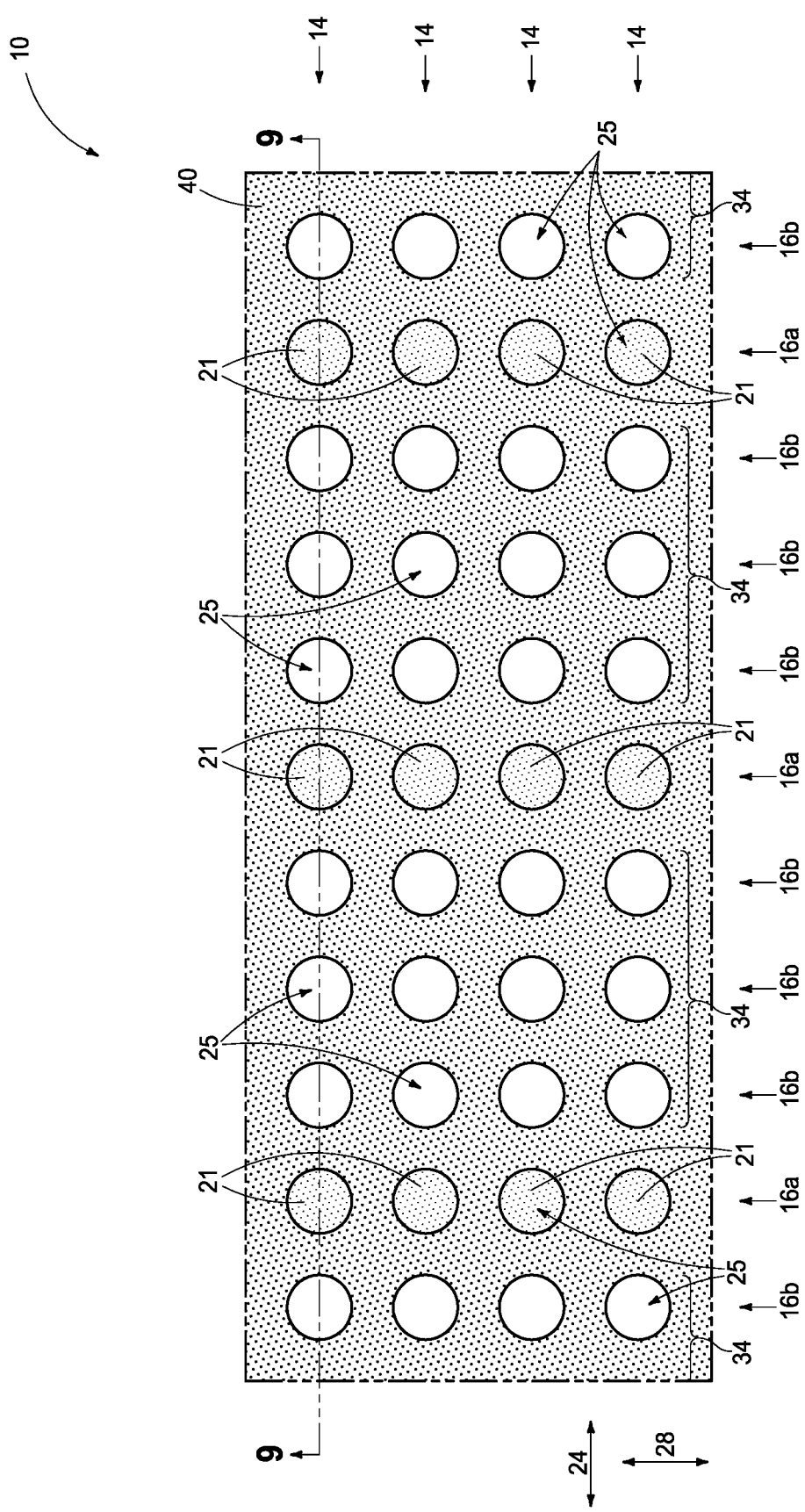
Figure 9:
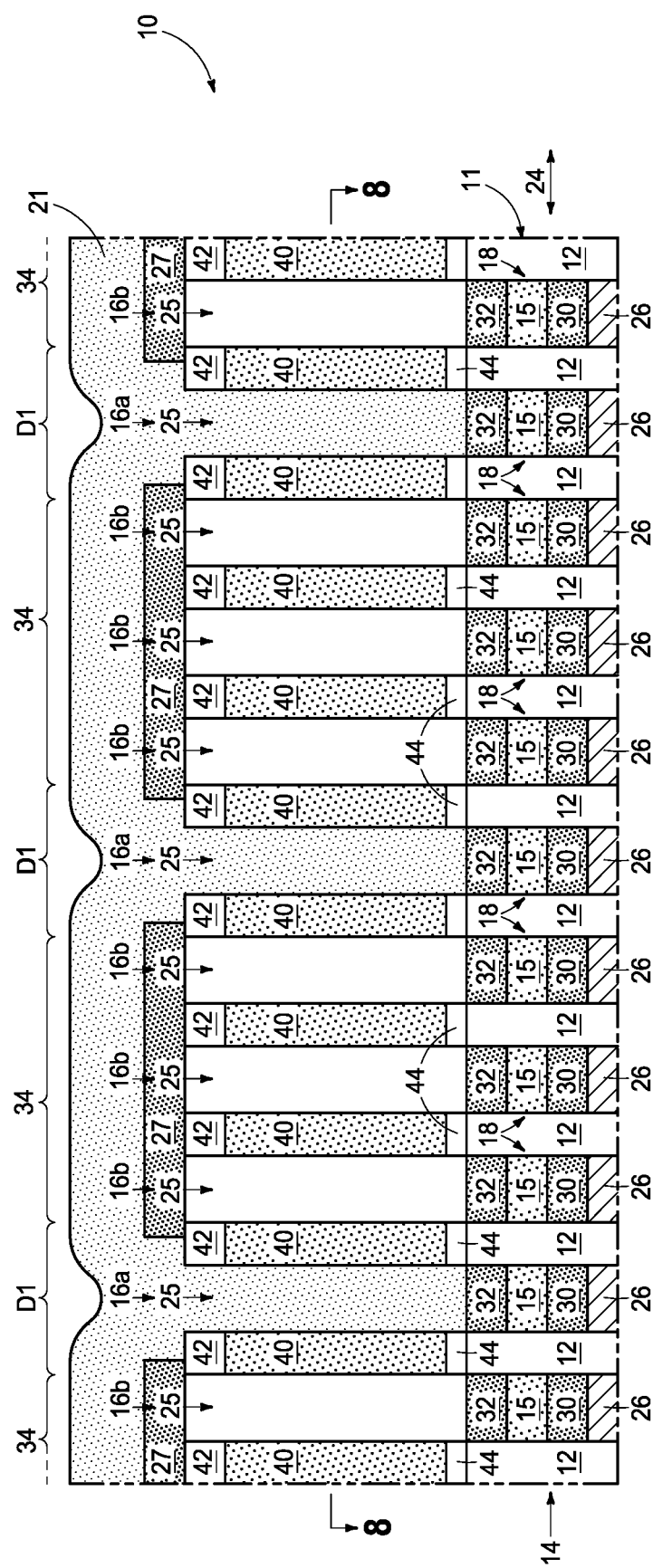
Figure 10:
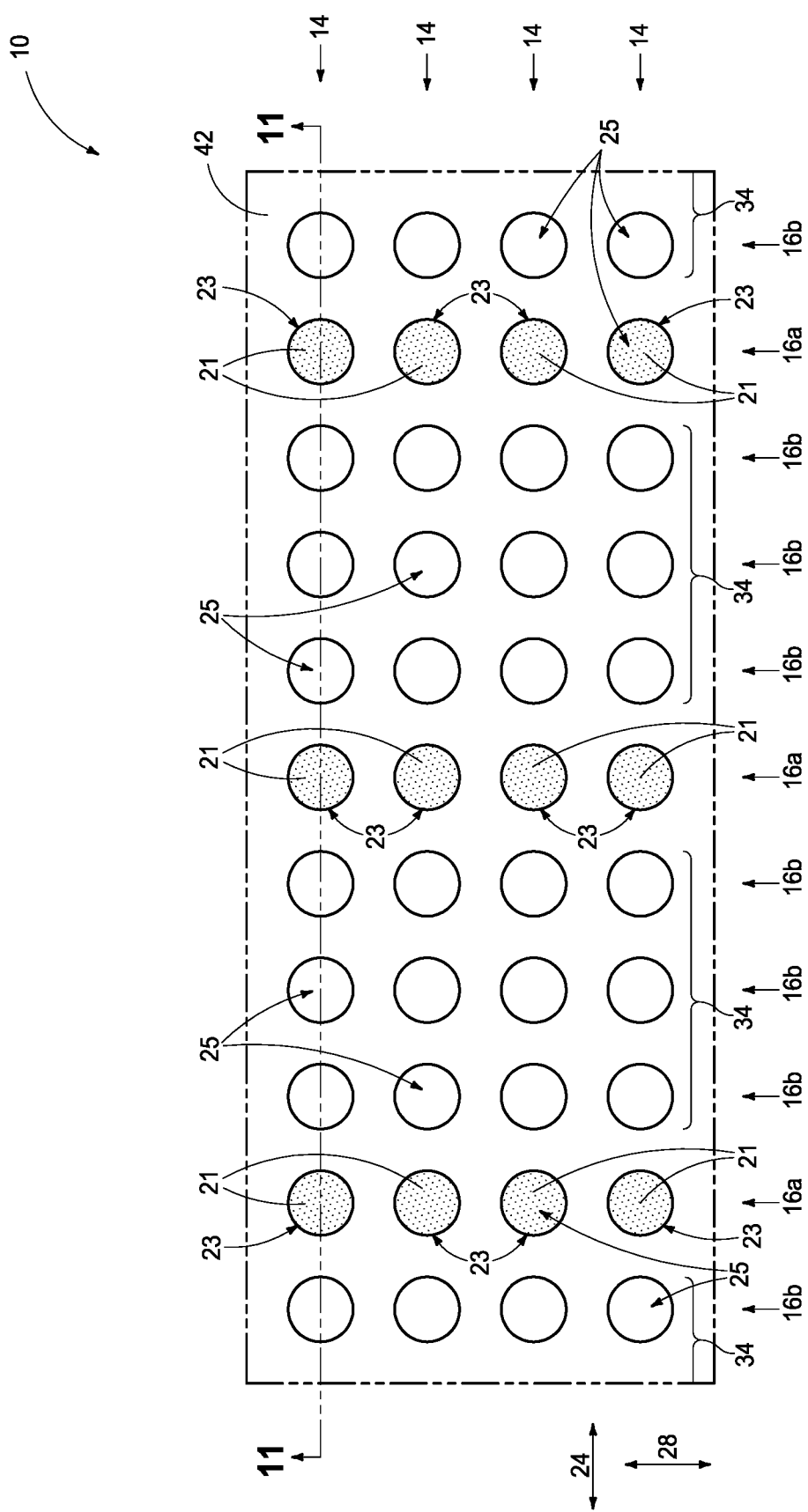
Figure 11:
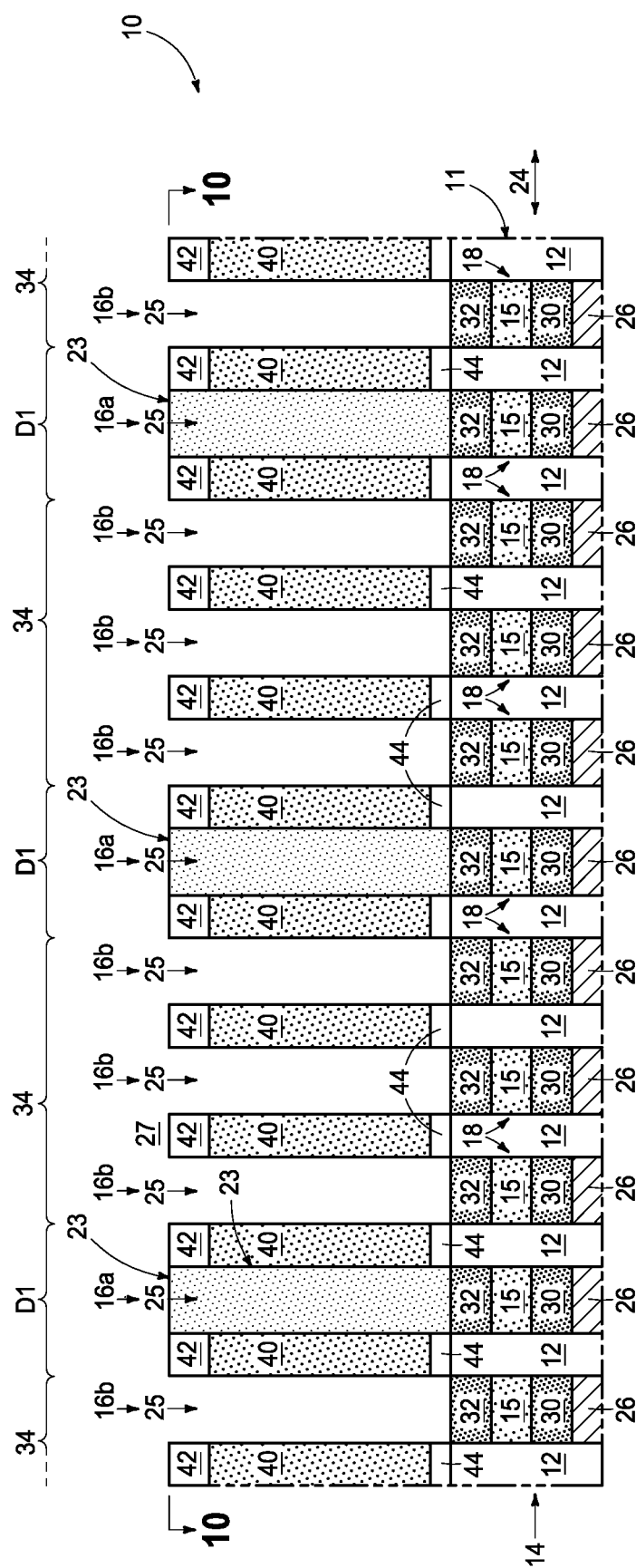

Referring to FIGS. 8 and 9, fill material 21 has been formed in exposed openings 25. FIGS. 10 and 11 show fill material 21 as having been planarized back at least to a top surface of material 42 thereby removing masking material 27 (such thereby not being shown in FIGS. 10 and 11). Fill material 21 may be entirely sacrificial or remain in a finished construction. Fill material 21 may comprise a different composition from that of material 40 and pillars 23 thereof may be formed in openings 25 thereby. Fill material 21 and material 40 may be of the same composition relative one another and yet in such instance pillars 23 may exist if an interface between material 40 and fill material 21 is still perceptible. Regardless, immediately-adjacent groups 34 are horizontally spaced apart from one another by a gap (e.g., across D1) that in one embodiment comprises at least one of columns 16a of openings 25 comprising fill material 21 (e.g., pillars 23) therein. In one embodiment and as shown, all pillars 23 that are between immediately-adjacent individual groups 34 are arrayed in one and only one column 16a along column direction 28. In one embodiment, pillars 23 are 100% insulative.

Figure 12:
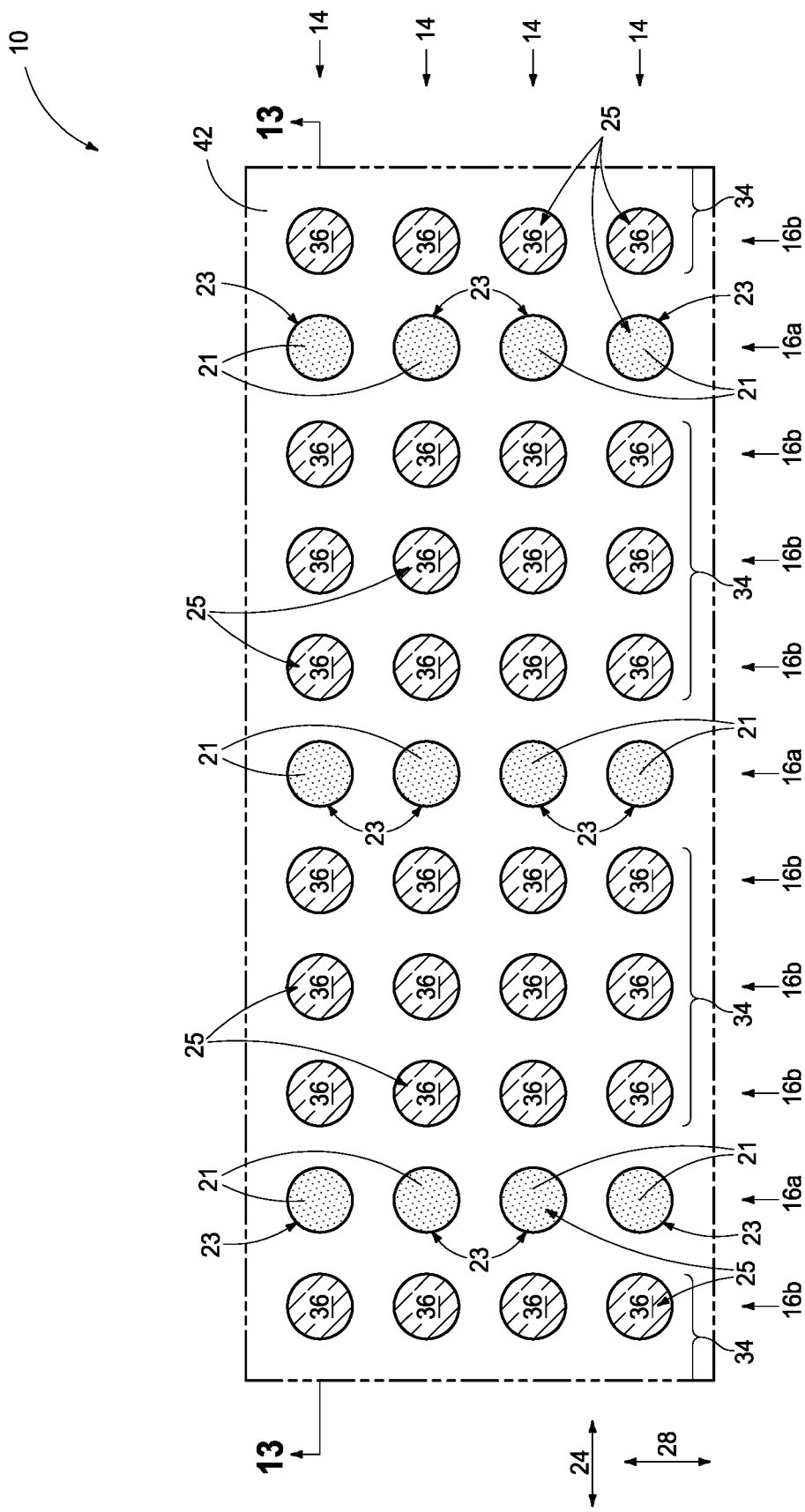
Figure 13:
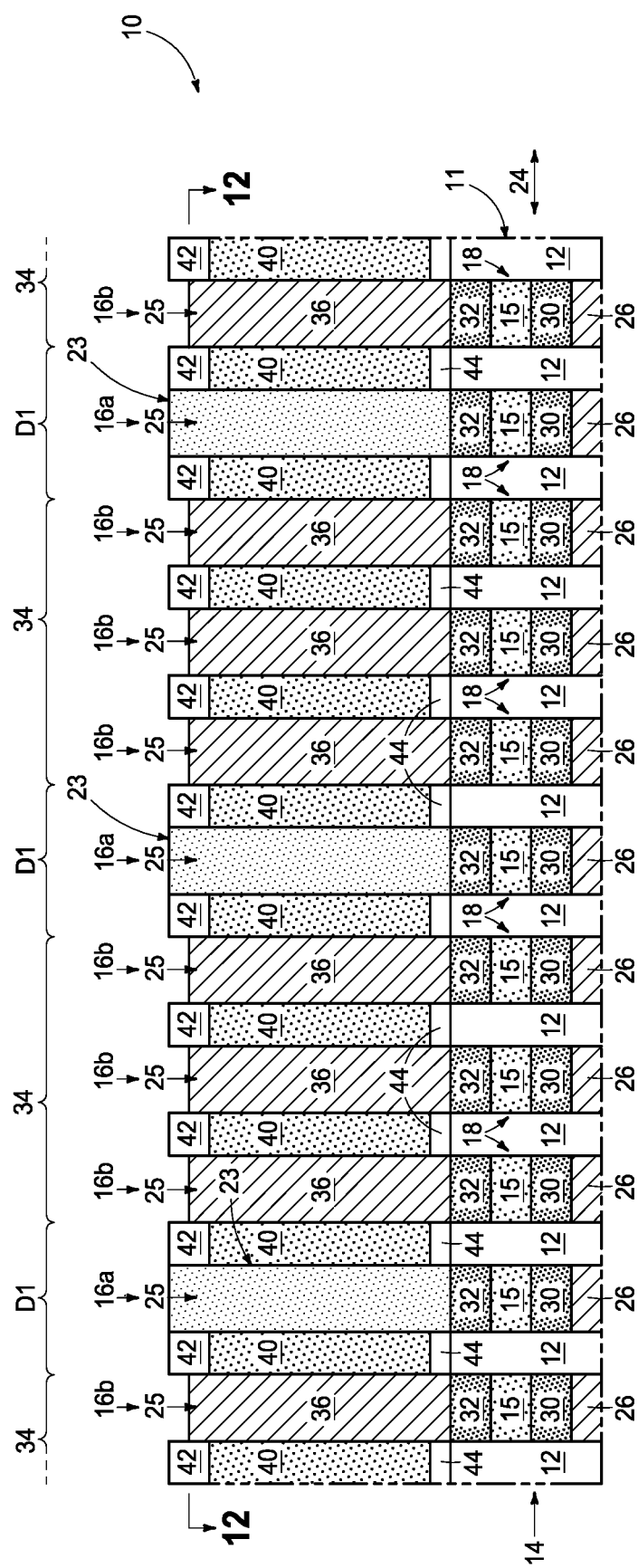

Referring to FIGS. 12 and 13, lower capacitor electrodes 36 have been formed in plurality of columns 16b that are between columns 16a of openings 25 that comprise the fill material 21 (e.g., pillars 23) and in one embodiment as shown directly electrically couple to transistors 18 there-below. Fill material 21 and lower capacitor electrodes 36 are of different compositions relative one another. Example materials for lower capacitor electrodes are conductively-doped semiconductive materials and metal materials, with an outer TiN liner and central W or conductively-doped doped polysilicon core being a couple of specific examples. Lower capacitor electrodes 36 may have a hollow core (not shown), may have a core comprising sacrificial material (not shown), or have a non-conductive core that remains in a finished construction of the circuitry being fabricated. Example lower capacitor electrodes 36 are shown as being vertically recessed relative to the top surface of material 42. In one embodiment and as shown, fill material 21 is formed before lower capacitor electrodes 36 are formed. Alternately, the reverse may occur (not shown). In one embodiment and as shown, pillars 23 are on pitch with lower capacitor electrodes 36 in their immediately-adjacent groups 34. In one embodiment and as shown, lower capacitor electrodes 36 are of the same size and shape relative one another and pillars 23 are of the same size and shape as lower capacitor electrodes 36.

Figure 14:
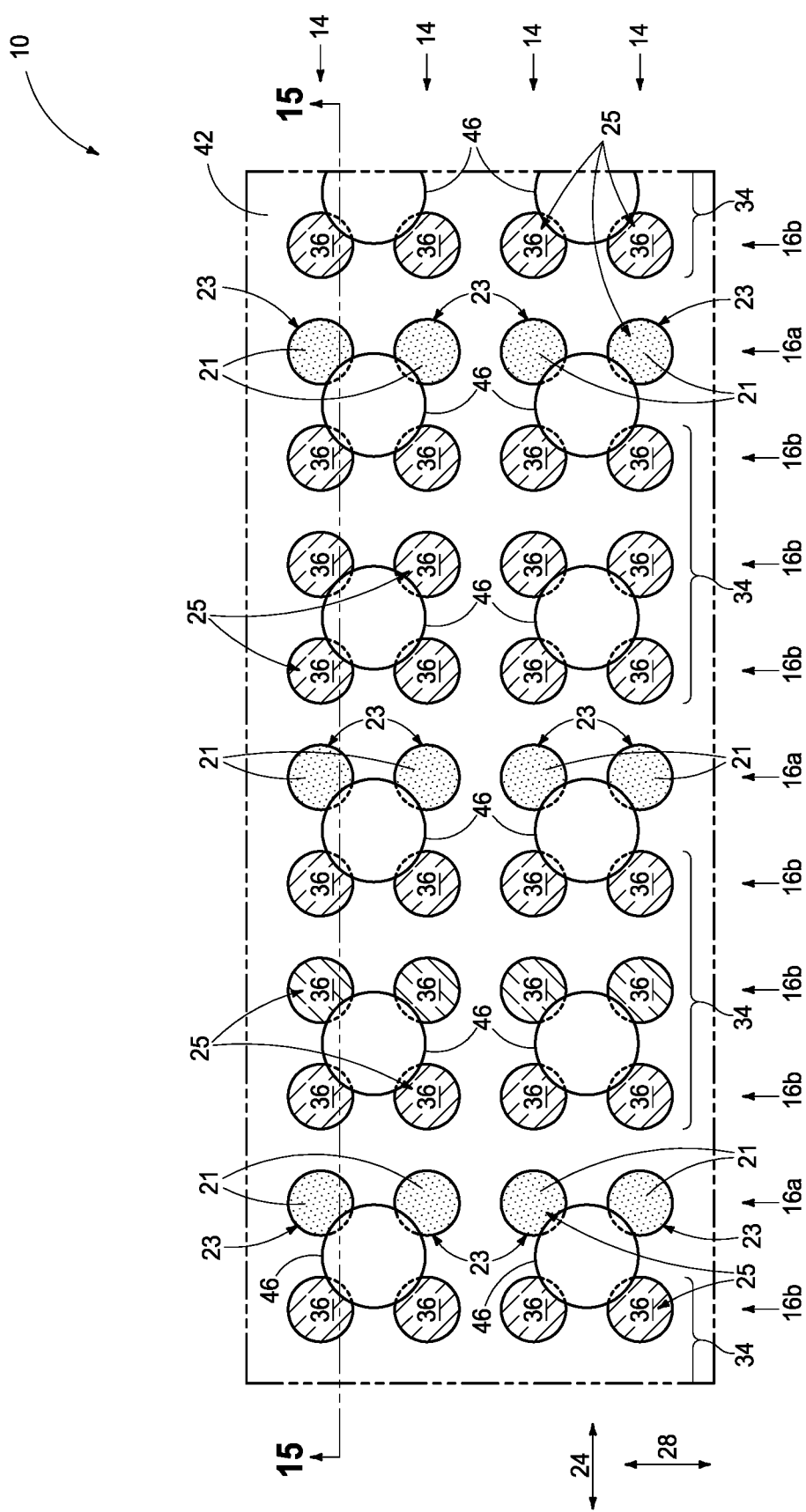
Figure 15:
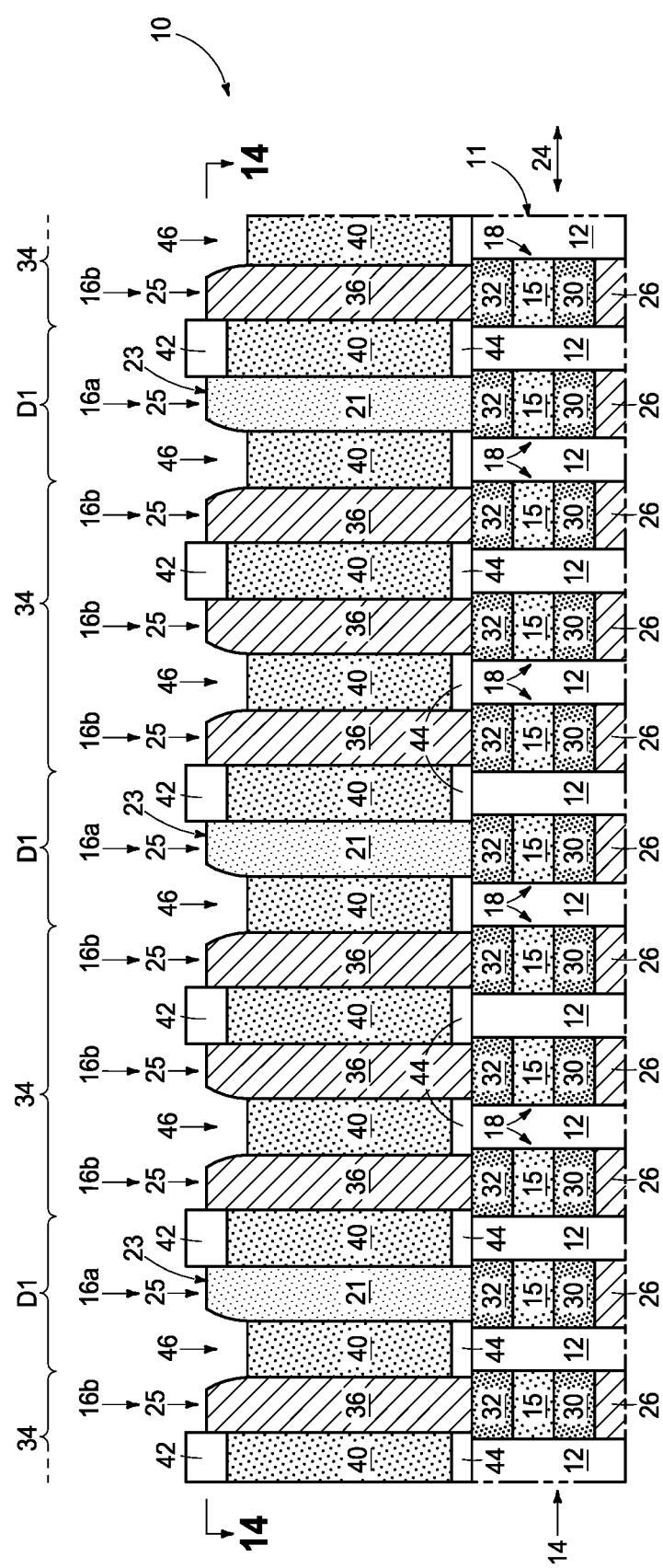

Referring to FIGS. 14 and 15, openings 46 have been formed through material 42 to provide access to sacrificial material 40 there-below. The relative diameters of lower capacitor electrodes 36, openings 46, and the spaces between the lower capacitor electrodes can be the same, greater, or lesser than each other.

Figure 16:
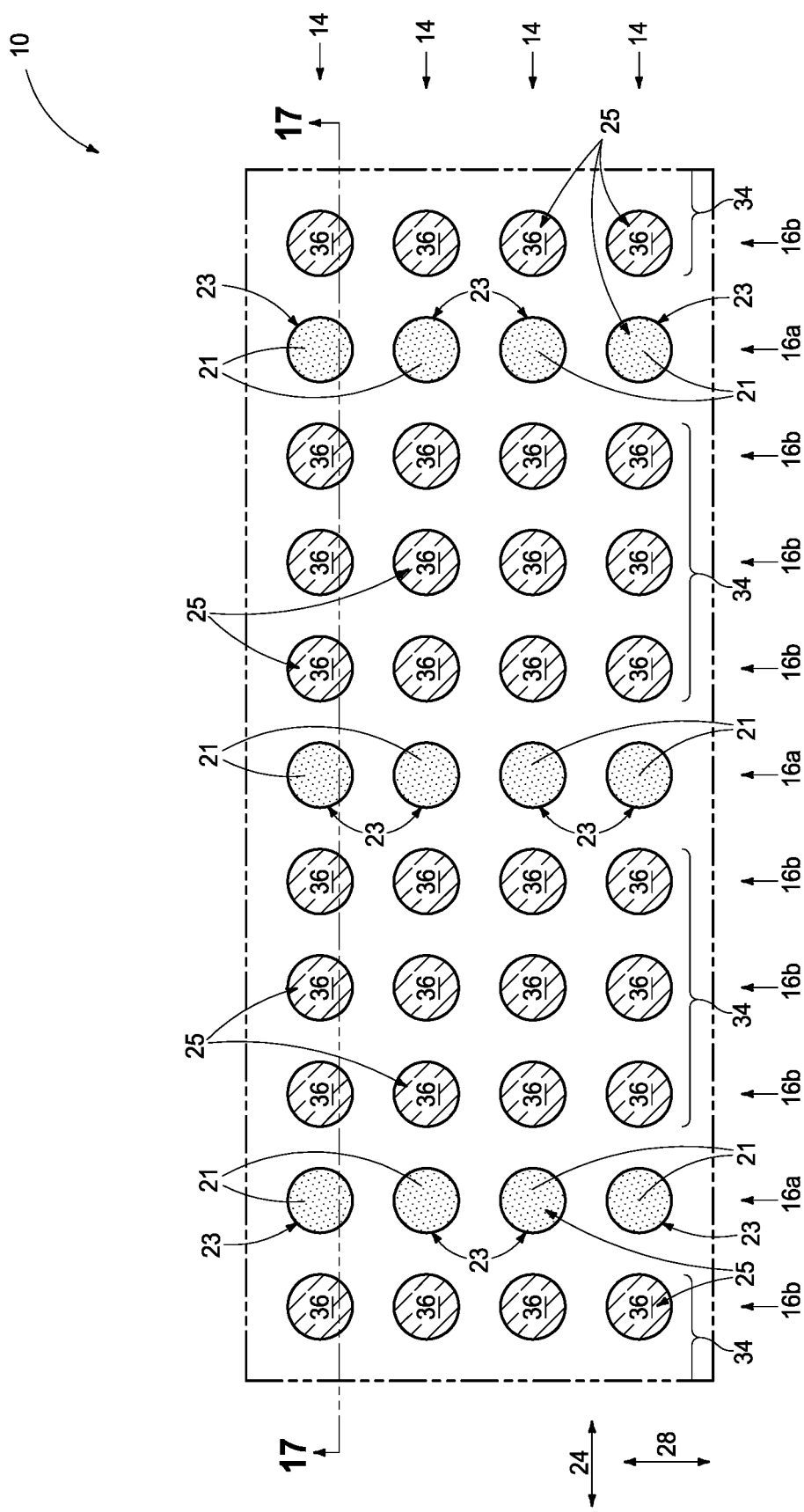
Figure 17:
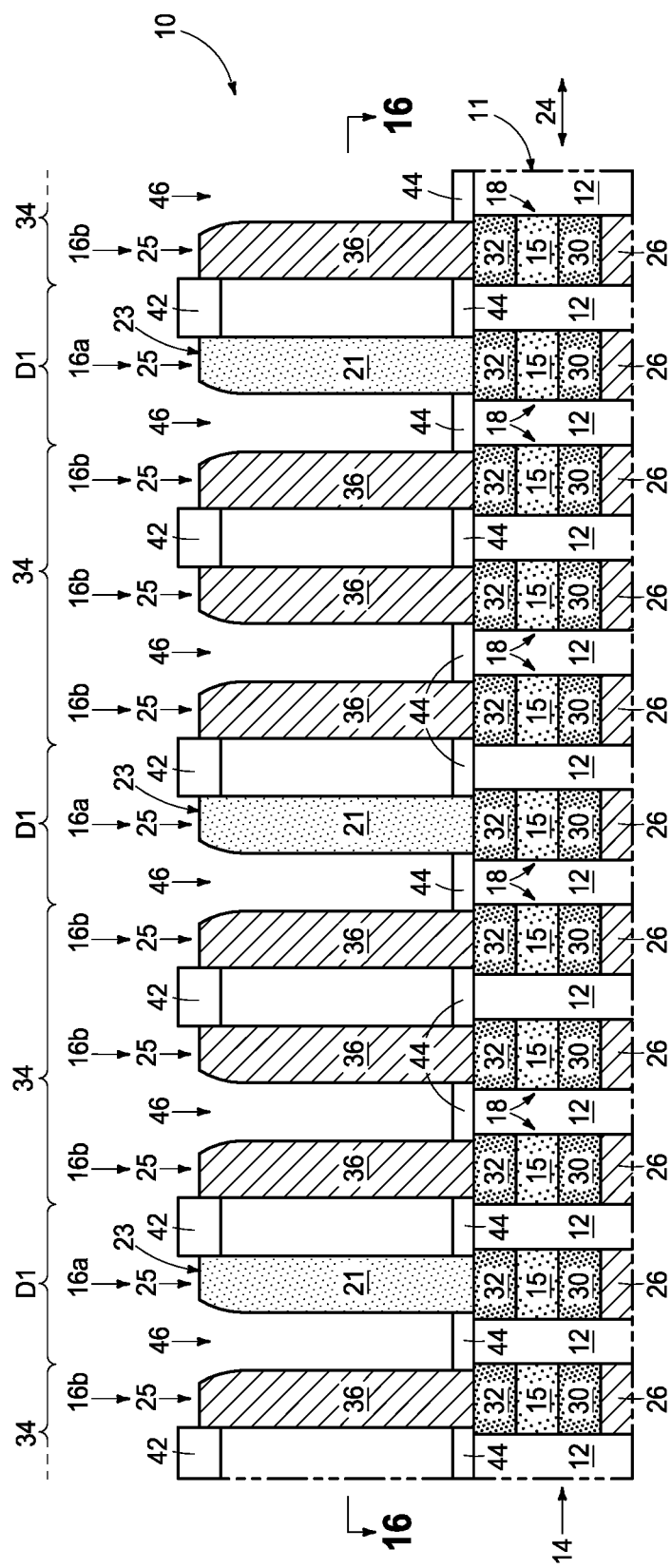

FIGS. 16 and 17 show subsequent processing whereby sacrificial material 40 (not shown) has been removed (e.g., by isotropic wet etching selectively relative to lower capacitor electrodes 36 and materials 21, 42, and 44).

Figure 18:
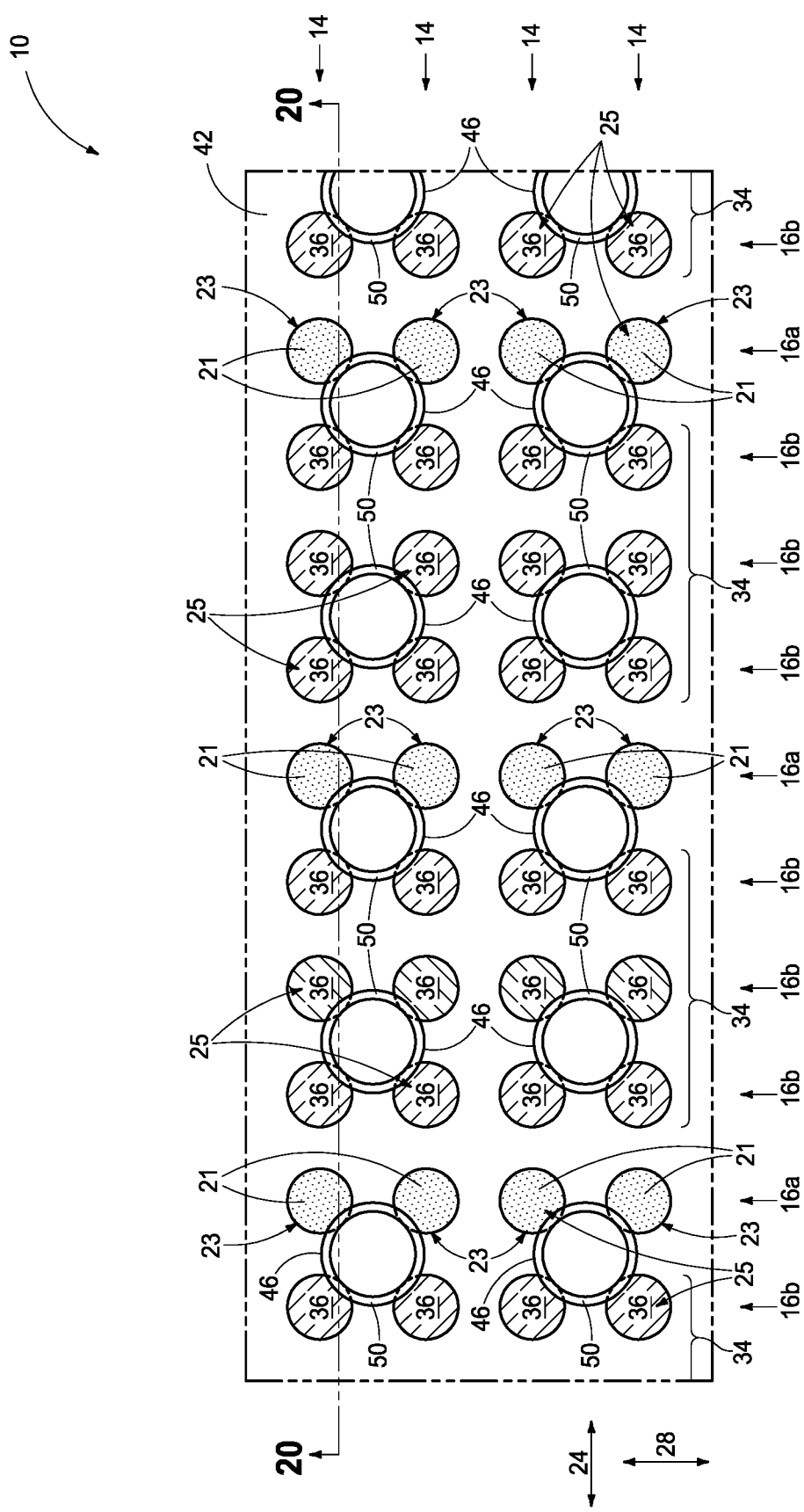
Figure 19:
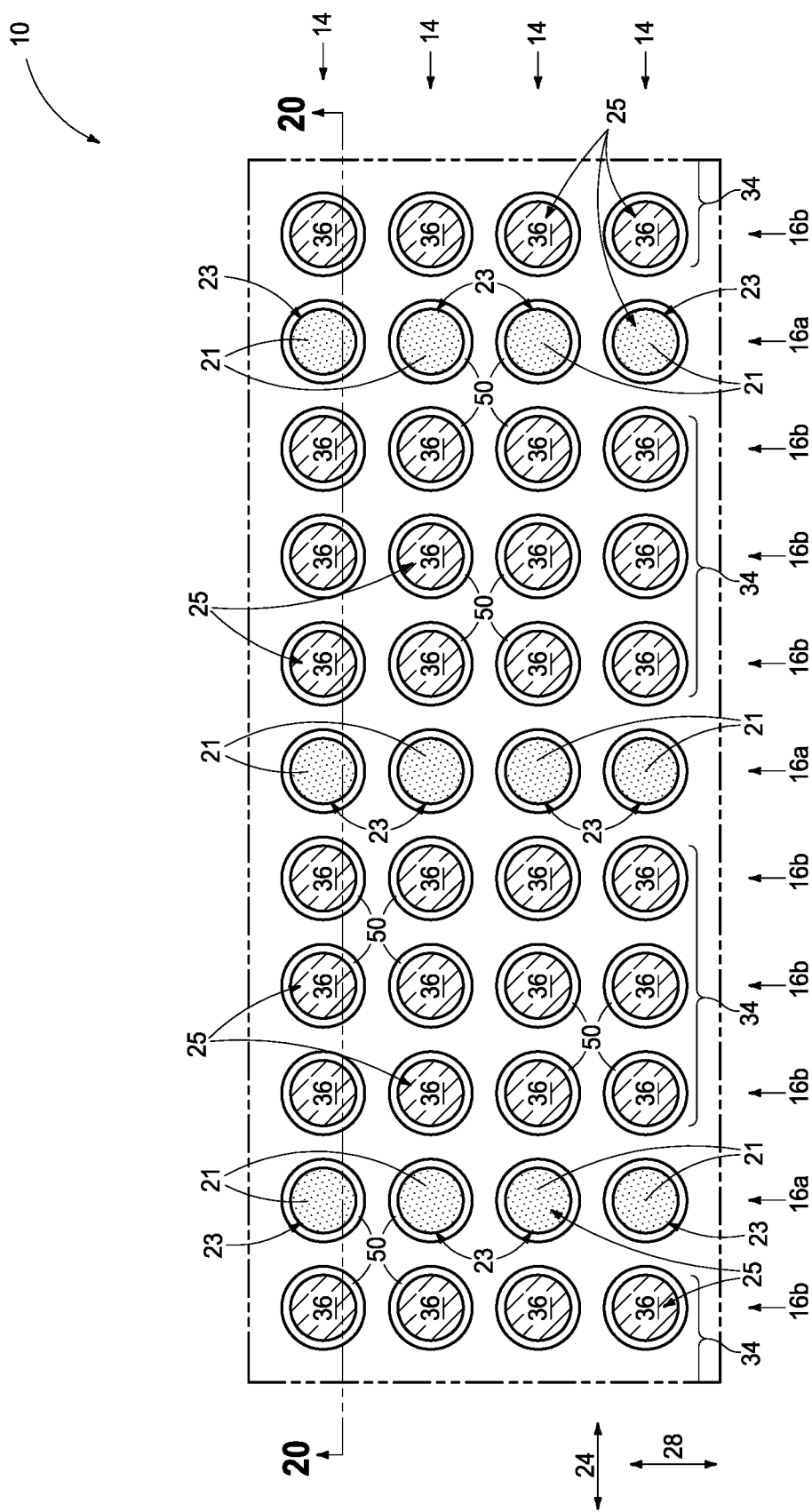
Figure 20:
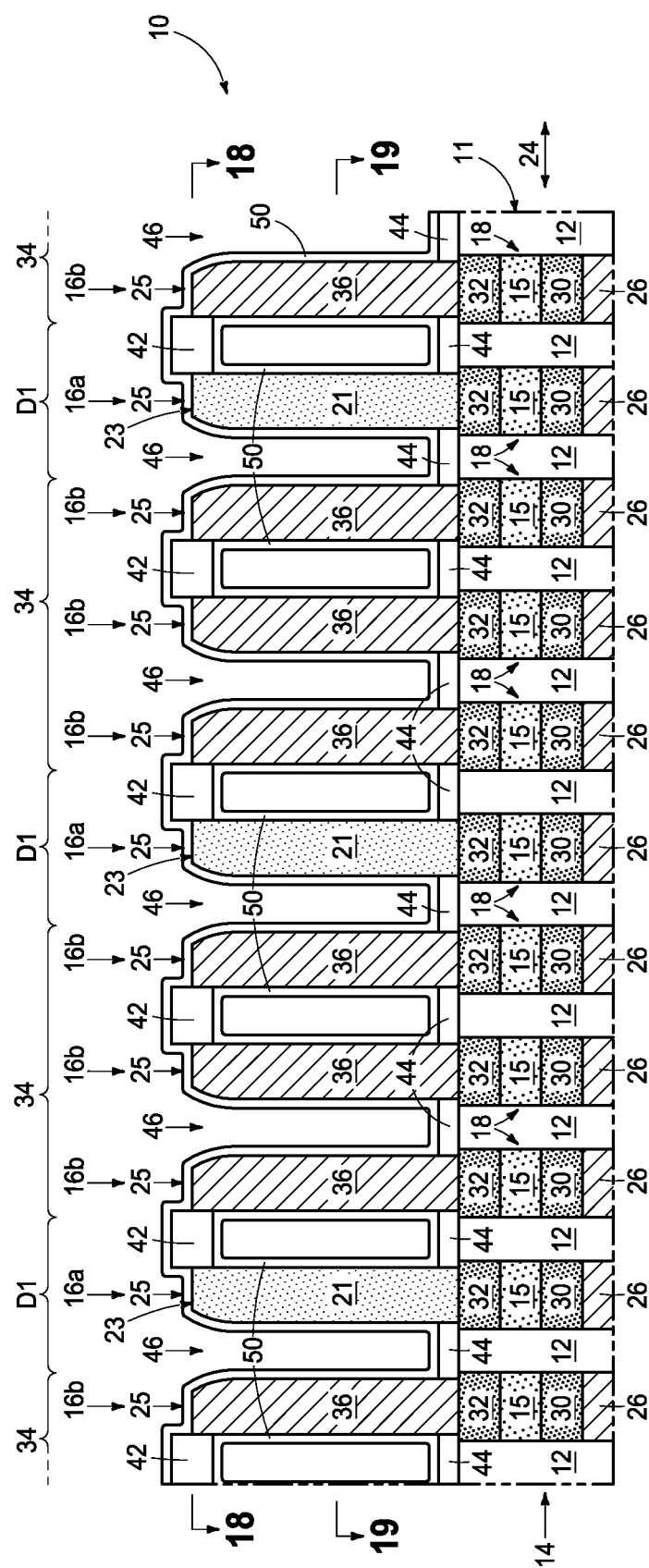

Referring to FIGS. 18-20, a capacitor insulator 50 has been formed over lower capacitor electrodes 36, and in some embodiments as shown over tops and laterally-outer sides thereof and over pillars 23. Capacitor insulator 50 may comprise any existing or future-developed insulator material (e.g., silicon dioxide, silicon nitride, hafnium oxide, aluminum oxide, etc.) and in one embodiment capacitor insulator 50 is ferroelectric (e.g., any existing or future-developed ferroelectric material).

Figure 21:
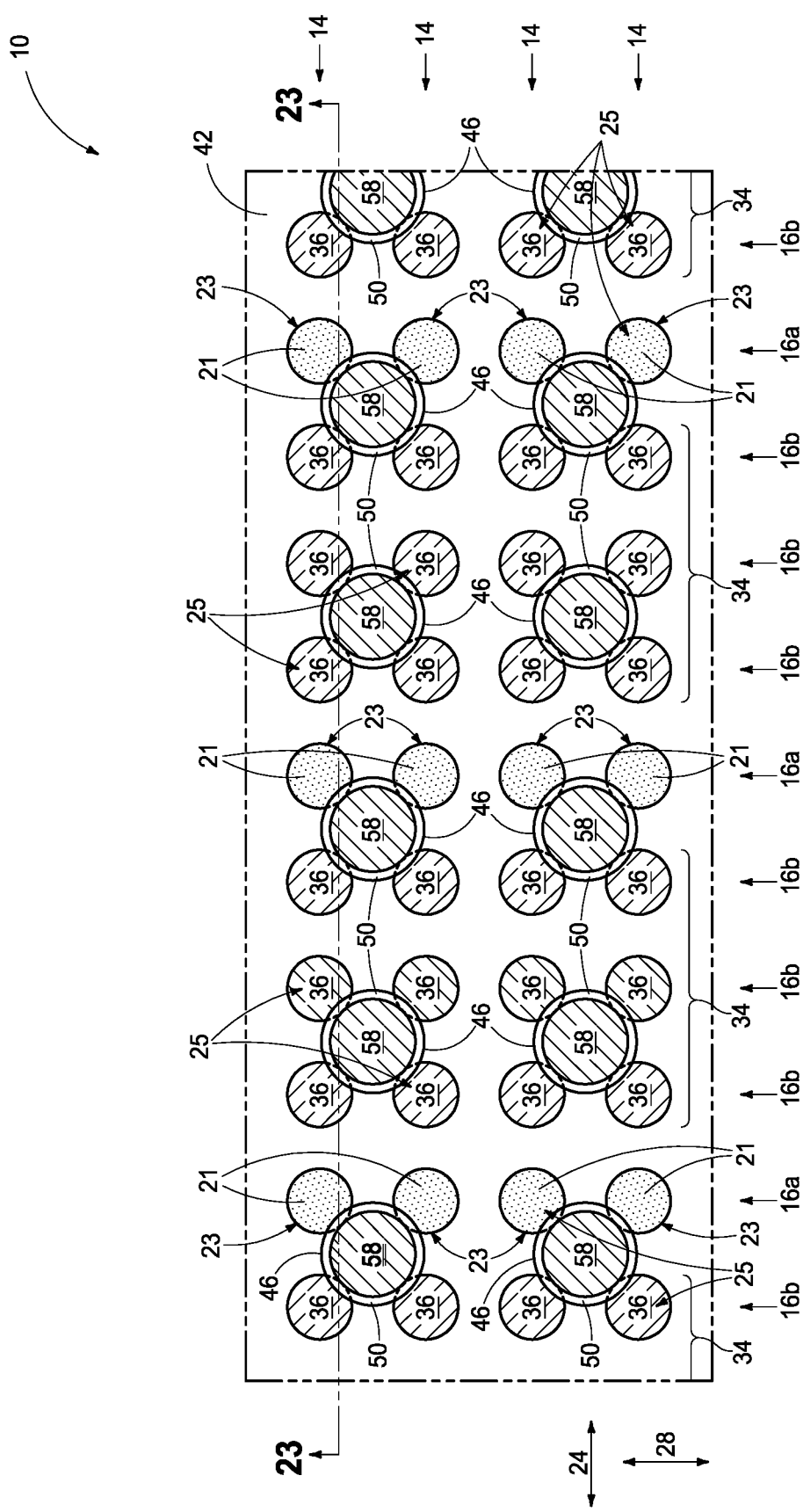
Figure 22:
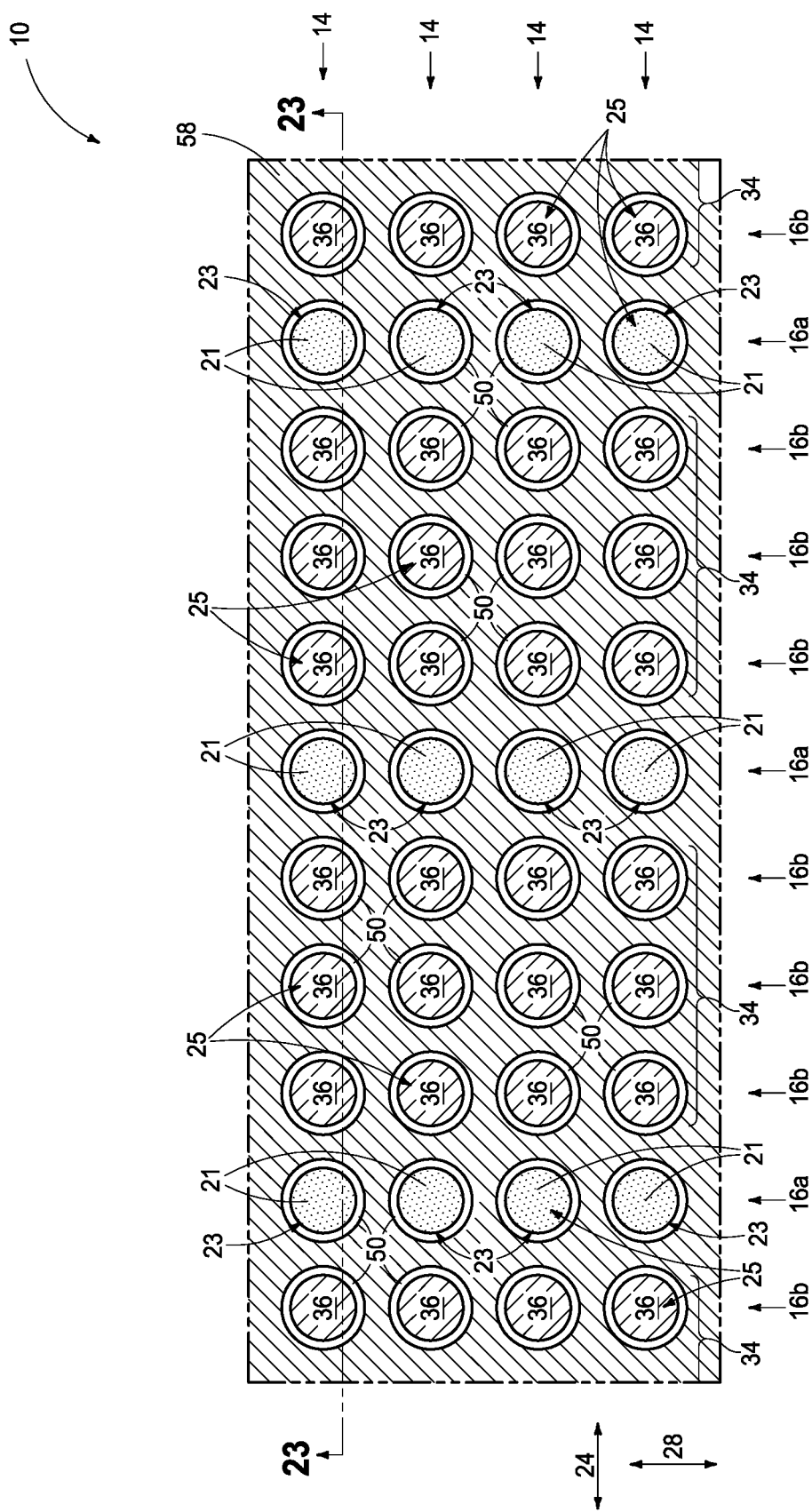
Figure 23:
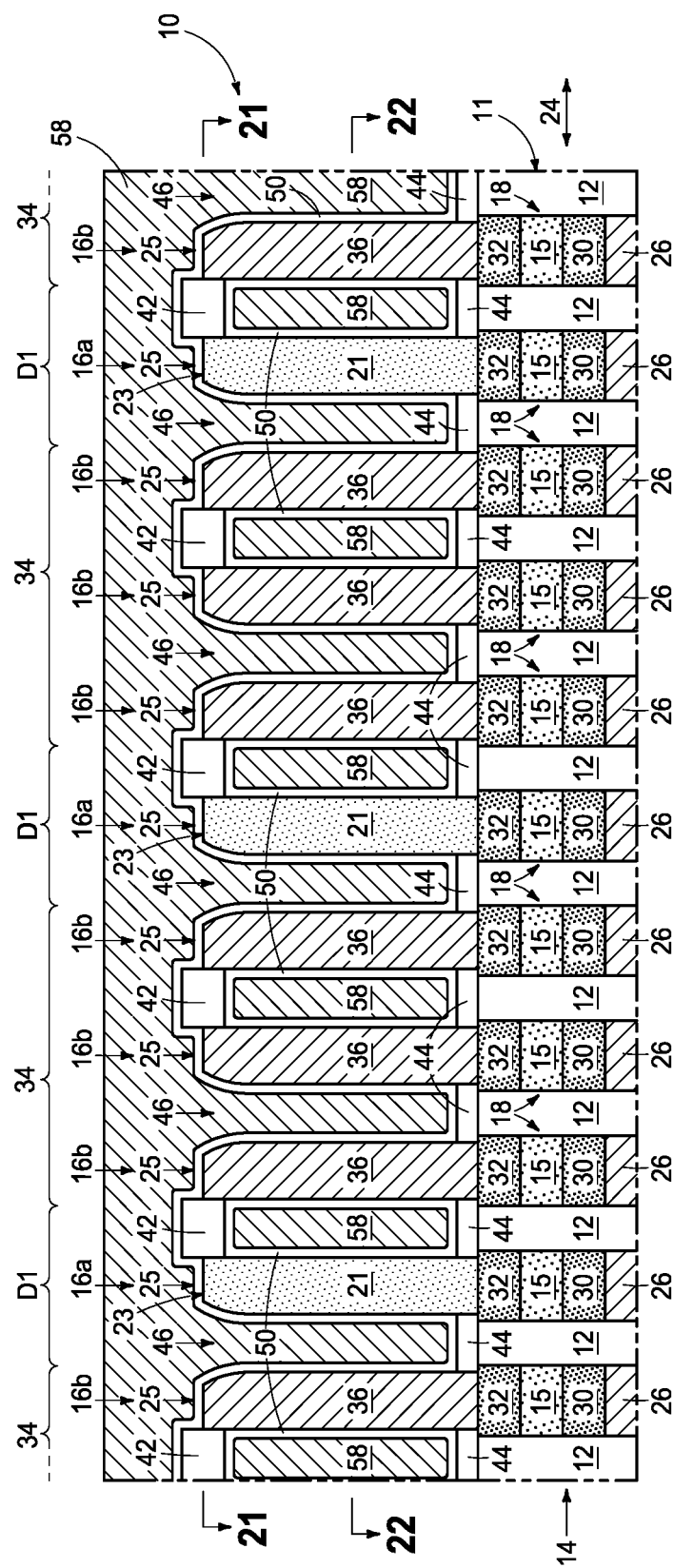
Figure 24:
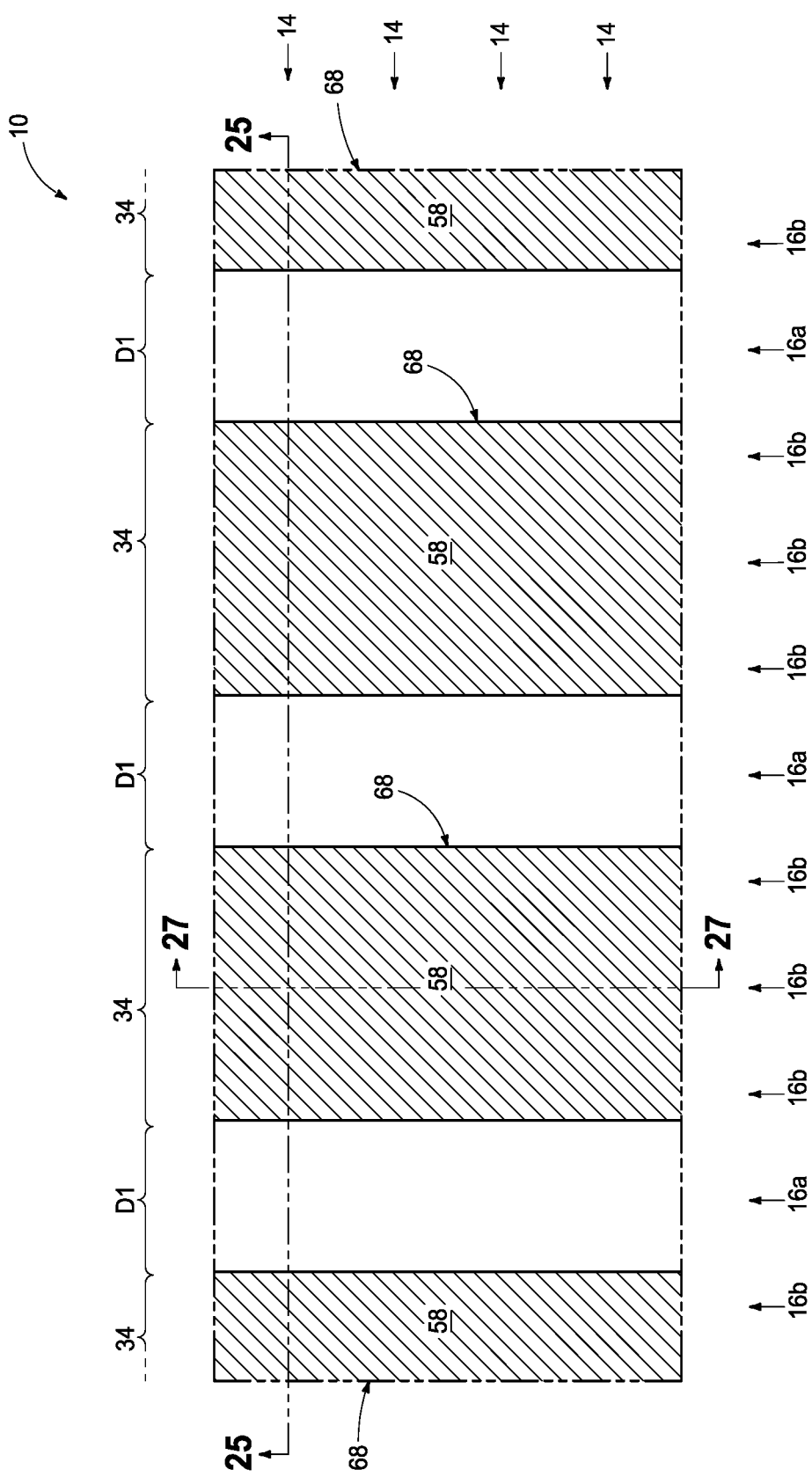
Figure 25:
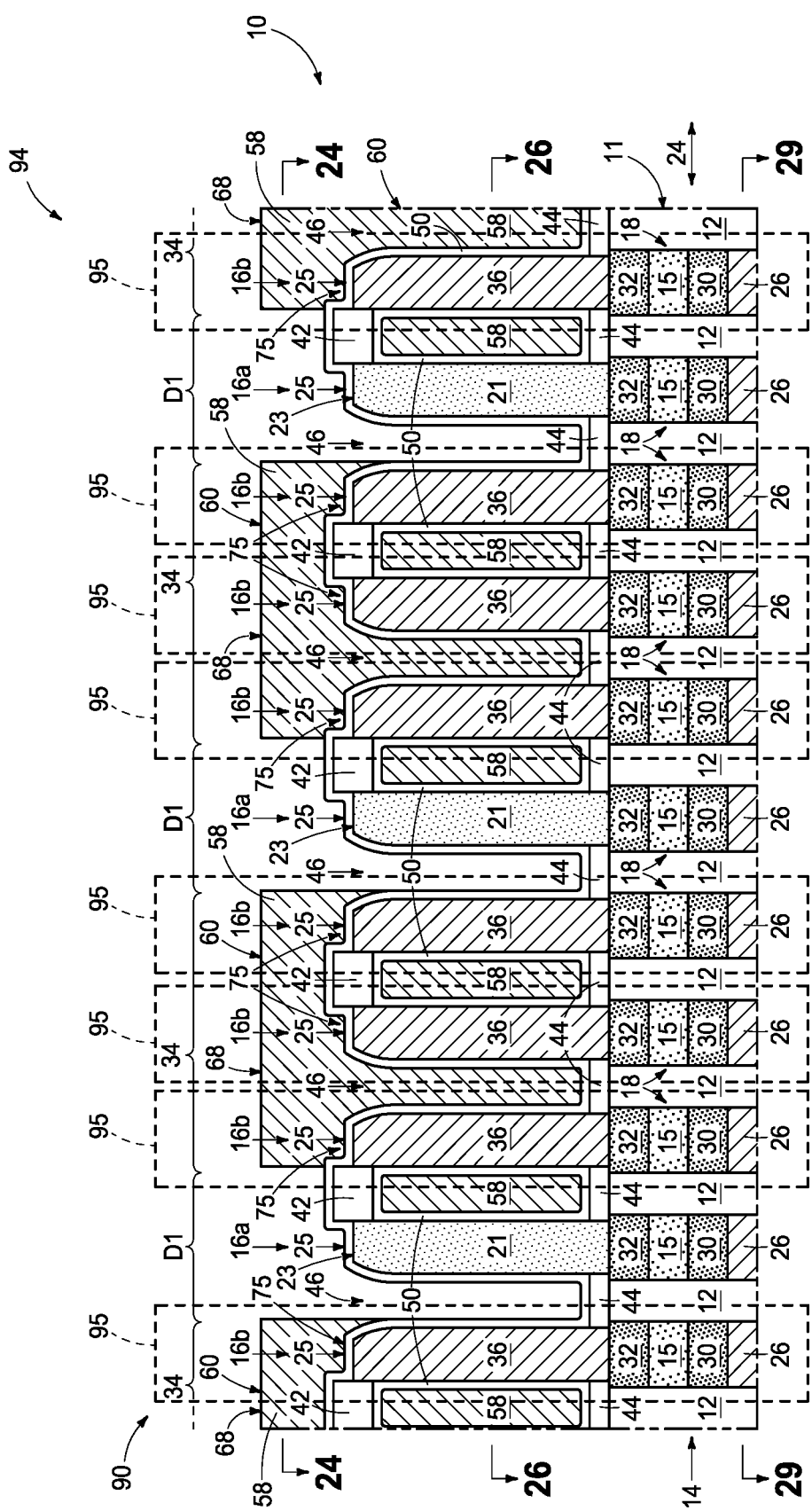
Figure 26:
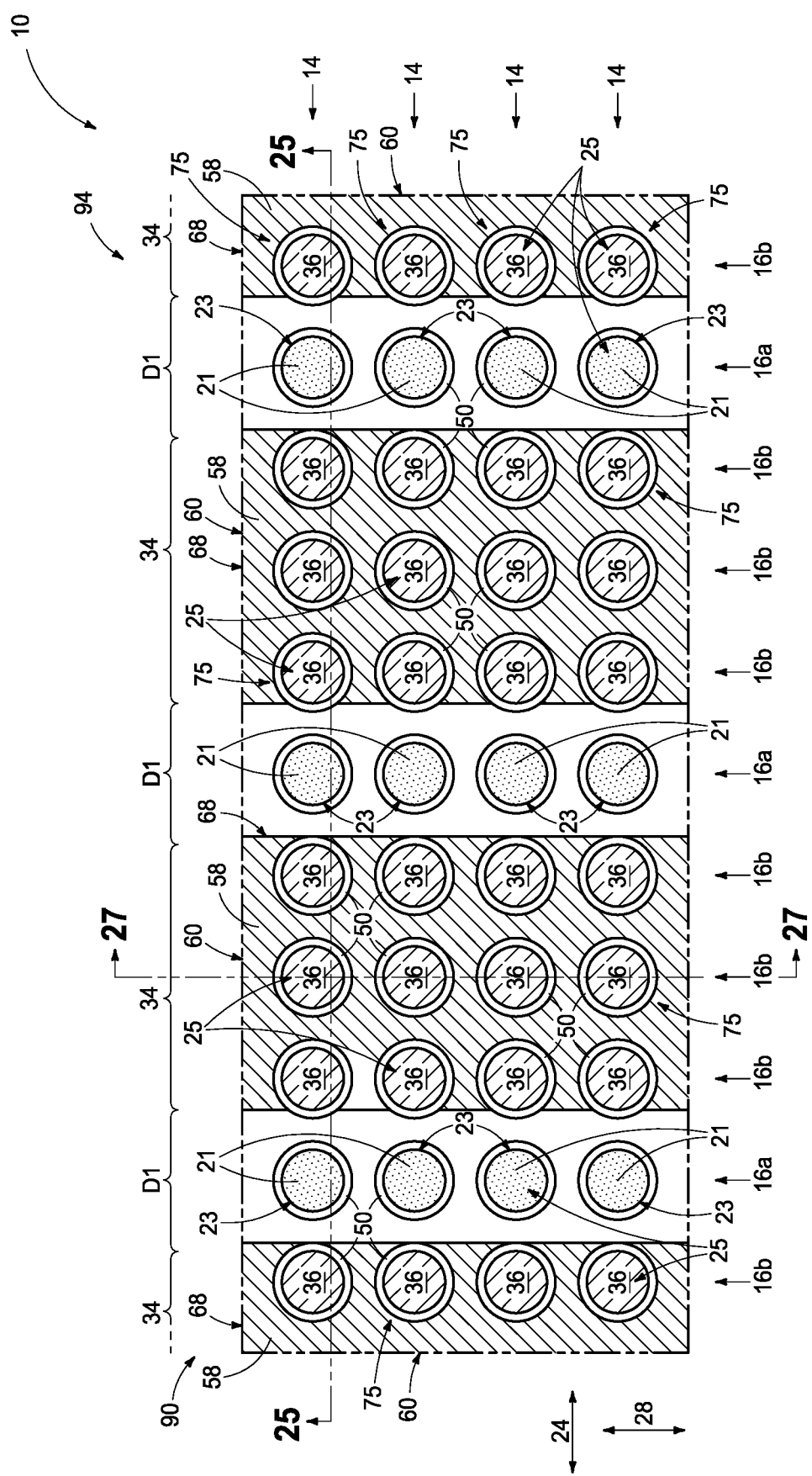
Figure 27:
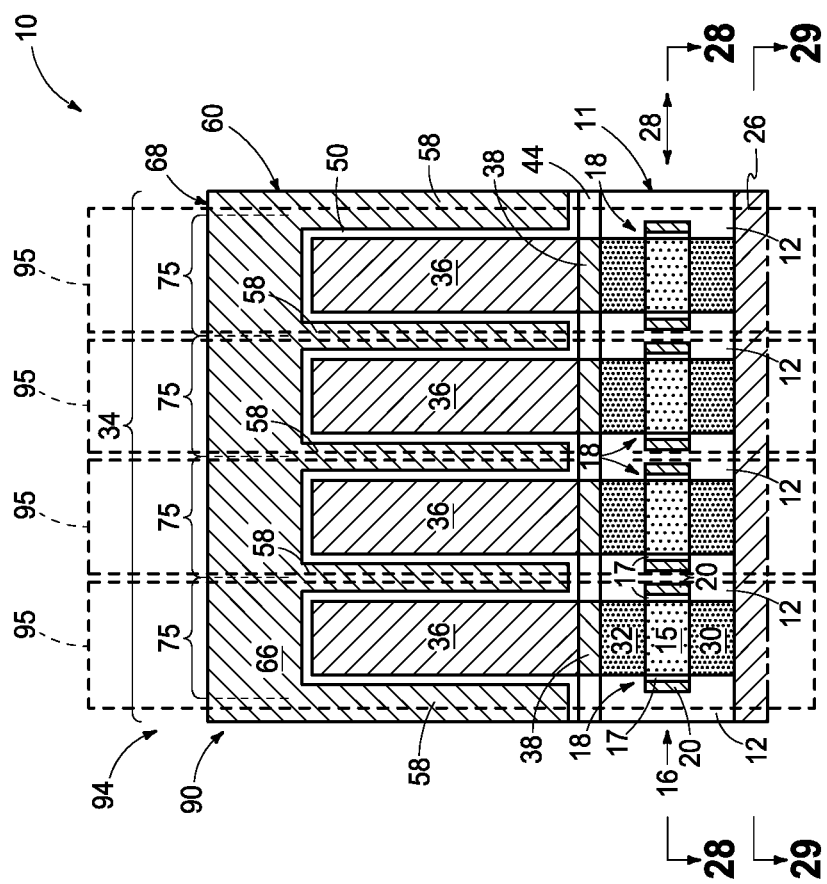
Figure 28:
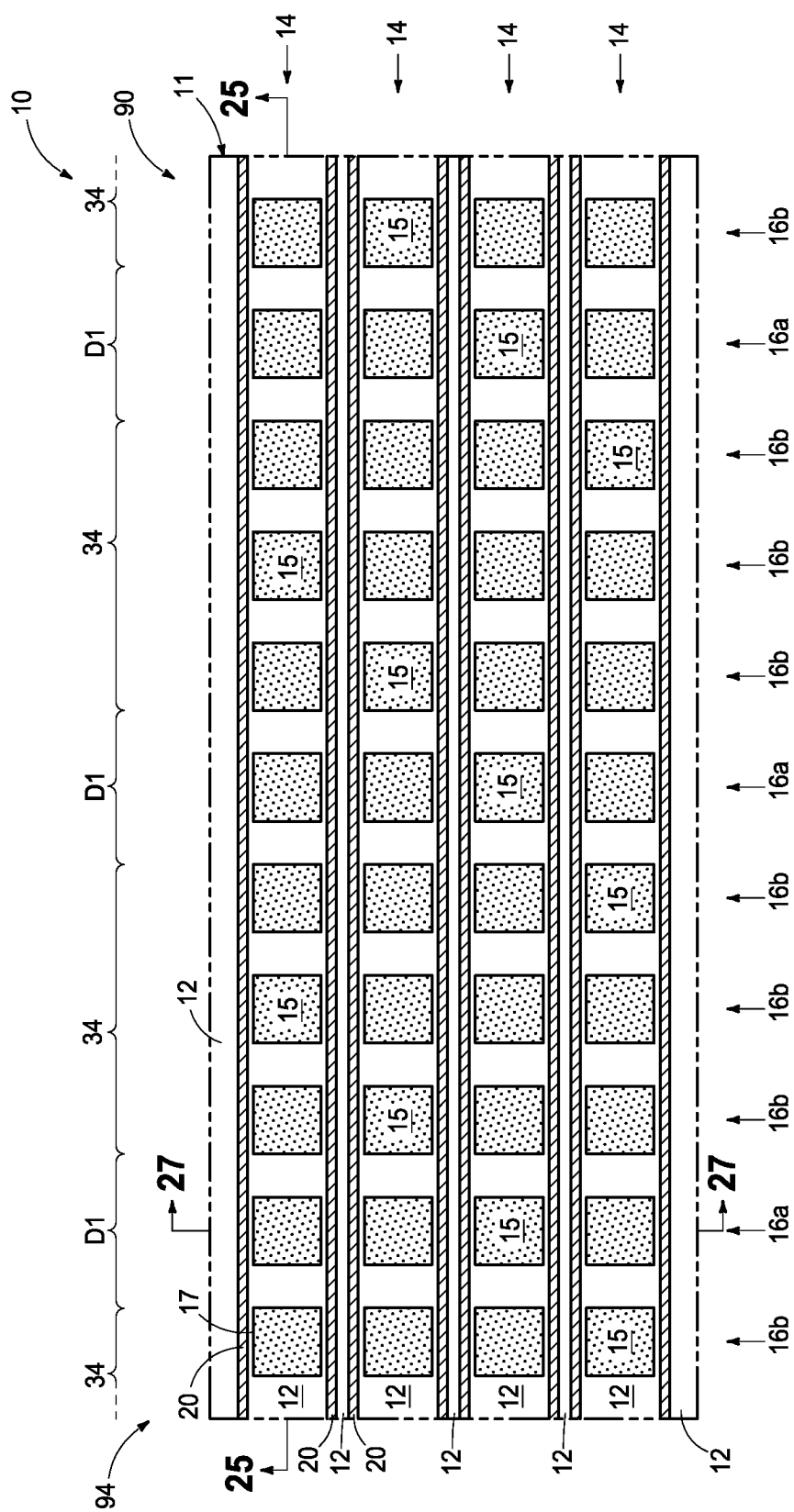
Figure 29:
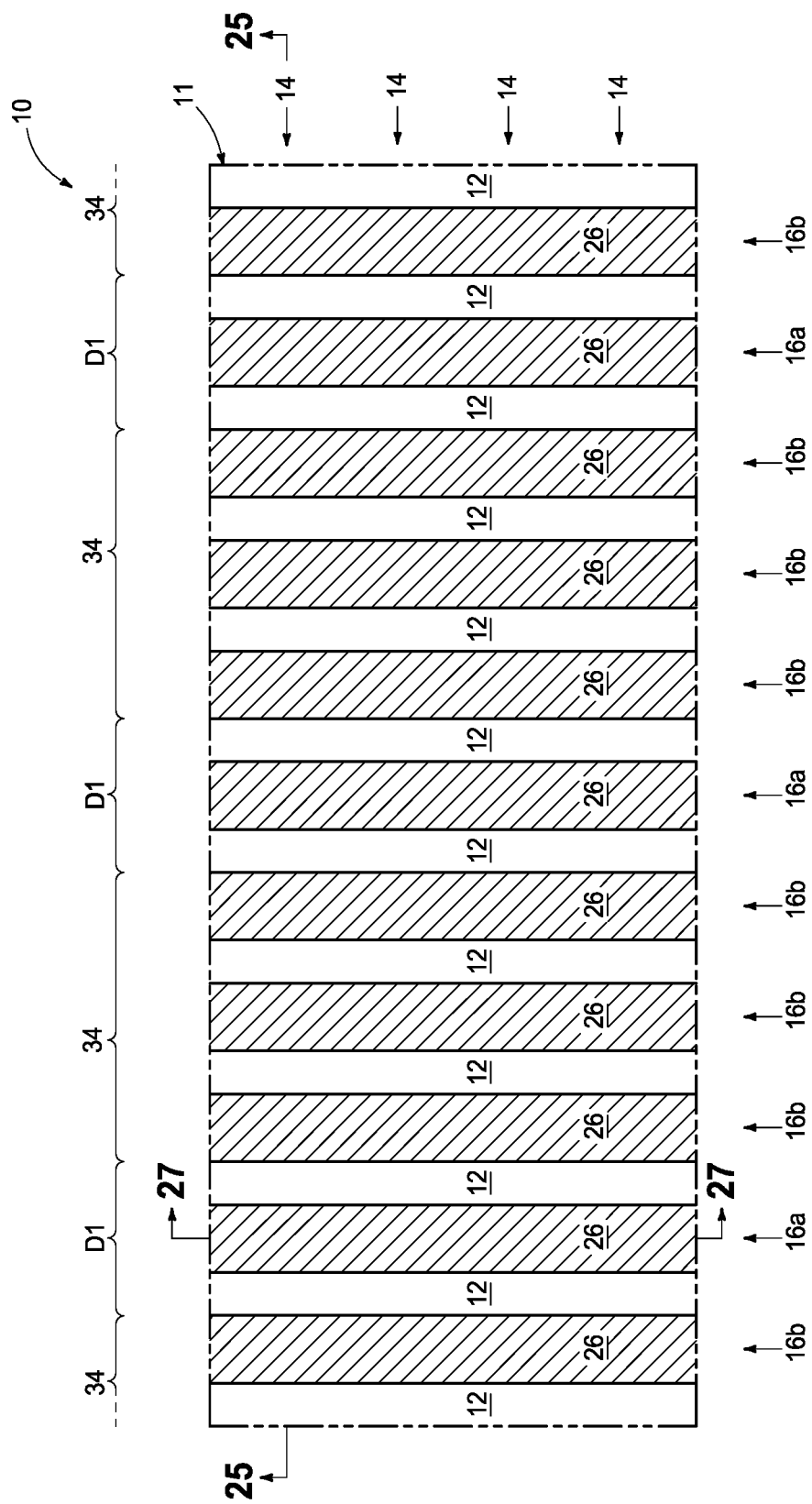

Referring to FIGS. 21-23, upper capacitor electrode material 58 (e.g., W over TiN) had been formed over capacitor insulator 50 and lower capacitor electrodes 36 (and over pillars 23 when present). A horizontally-elongated conductive line (not yet shown) is ultimately formed atop individual groups 34 and that directly electrical couples the upper capacitor electrode material 58 there-below that is in that individual group 34.

In one embodiment and as shown, upper capacitor electrode material 58 extends across the gap between immediately-adjacent groups 34 and thereby connects upper capacitor electrode material 58 that is in immediately-adjacent groups 34. FIGS. 24-29 show removing at least a portion of upper capacitor electrode material 58 from the gap (e.g., by photolithographic patterning and etch) to disconnect it from being connected between immediately-adjacent groups 34, thereby forming a horizontally-elongated conductive line 68 atop individual of the groups that directly electrically couples together the upper capacitor electrode material 58 there-below in that individual group 34. Thus, as one example, such forms conductive line 68 and upper capacitor electrode material 58 there-below as being an upper capacitor electrode 60 that is common to all capacitors within that individual group 34. Example such capacitors 75 within groups 34 individually comprise one of lower capacitor electrodes 36, capacitor insulator 50, and common upper capacitor electrode 60 in the respective individual group 34 (e.g., twelve example capacitors 75 being shown within individual groups 34 in FIG. 26). In one example embodiment and as shown, an array 90 of capacitors 75 has been formed as has a memory array 94 comprising individual memory cells 95.

Transistors 18 in columns 16a may not be provided (not shown) and if provided as shown may be operative or inoperative. Further and regardless, an embodiment of the invention comprises a method of forming an array (e.g., 90) of capacitors (e.g., 75) independent of whether such comprise part of a memory array and independent of whether such are formed relative to transistors that have been formed previously there-below.

Any other attribute(s) or aspect(s) as shown and/or described herein with respect to other embodiments may be used in the embodiments shown and described with reference to the above embodiments.

Figure 30:
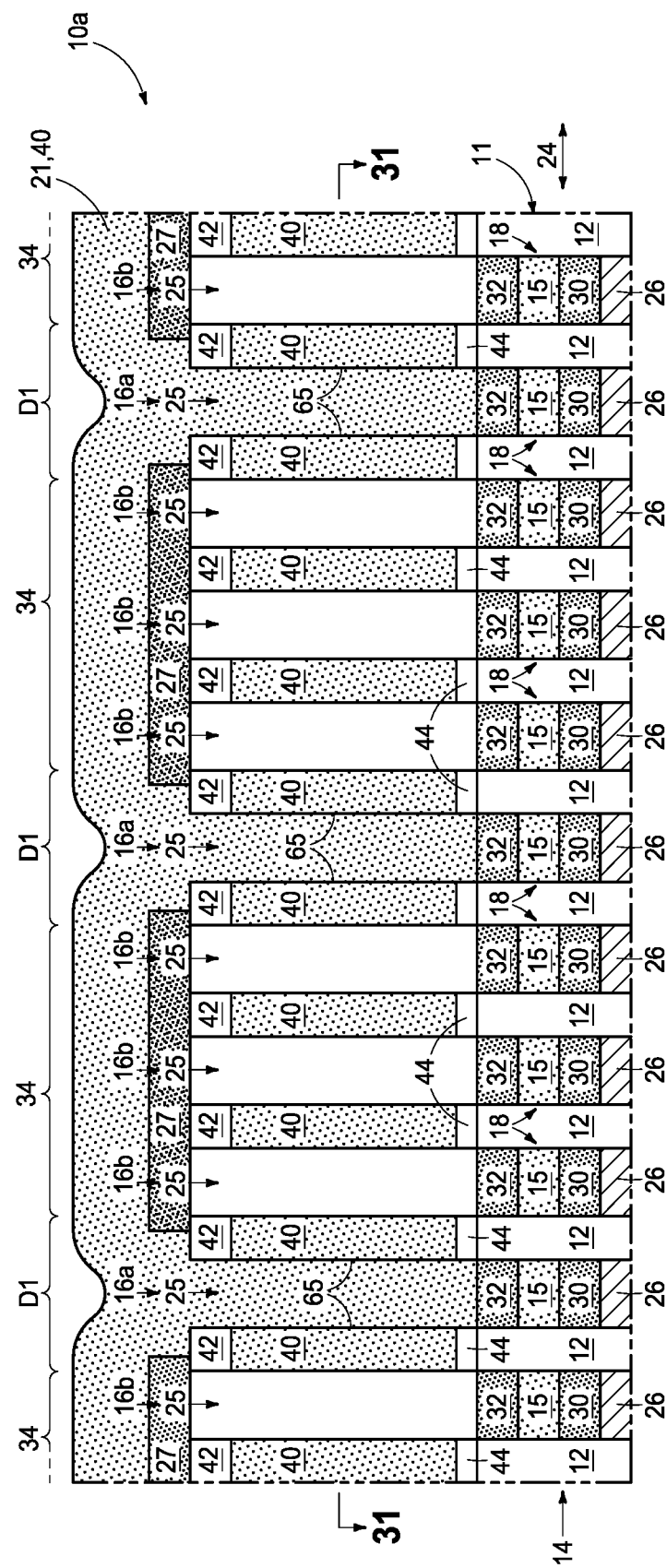
FIGS. 30-35 are diagrammatic sequential sectional views of a portion of a construction in process in accordance with some embodiments of the invention.
Figure 31:
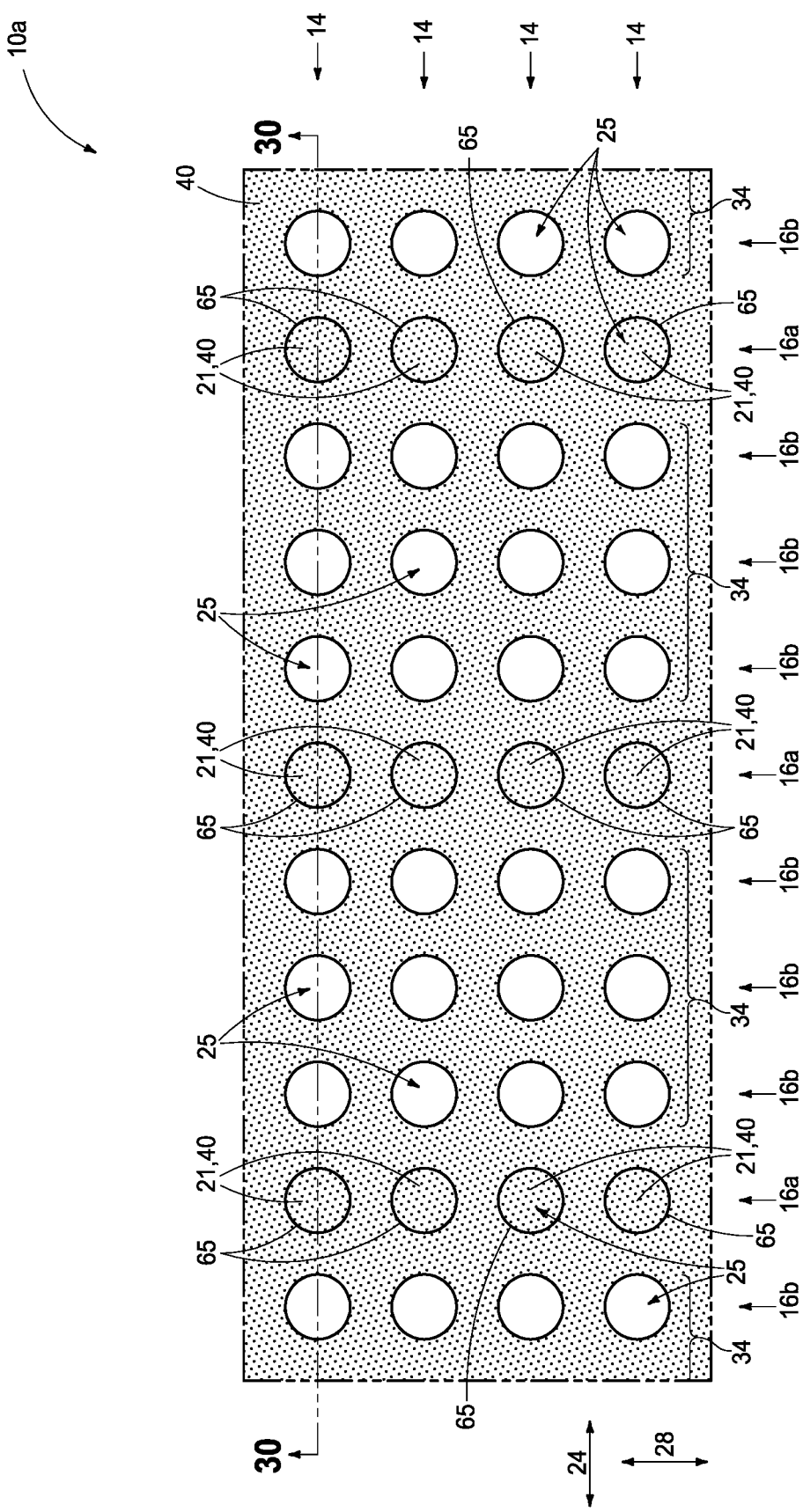

An alternate example embodiment construction 10a is next described with reference to FIGS. 30-35. Like numerals from the above-described embodiments have been used where appropriate, with some construction differences being indicated with the suffix "a" or with different numerals. FIGS. 30 and 31 correspond in processing sequence to that of FIGS. 8 and 9. In this example, fill material 21 and sacrificial material 40 are of the same composition relative one another. An example interface 65 there-between that may or may not be perceptible is shown.

Figure 32:
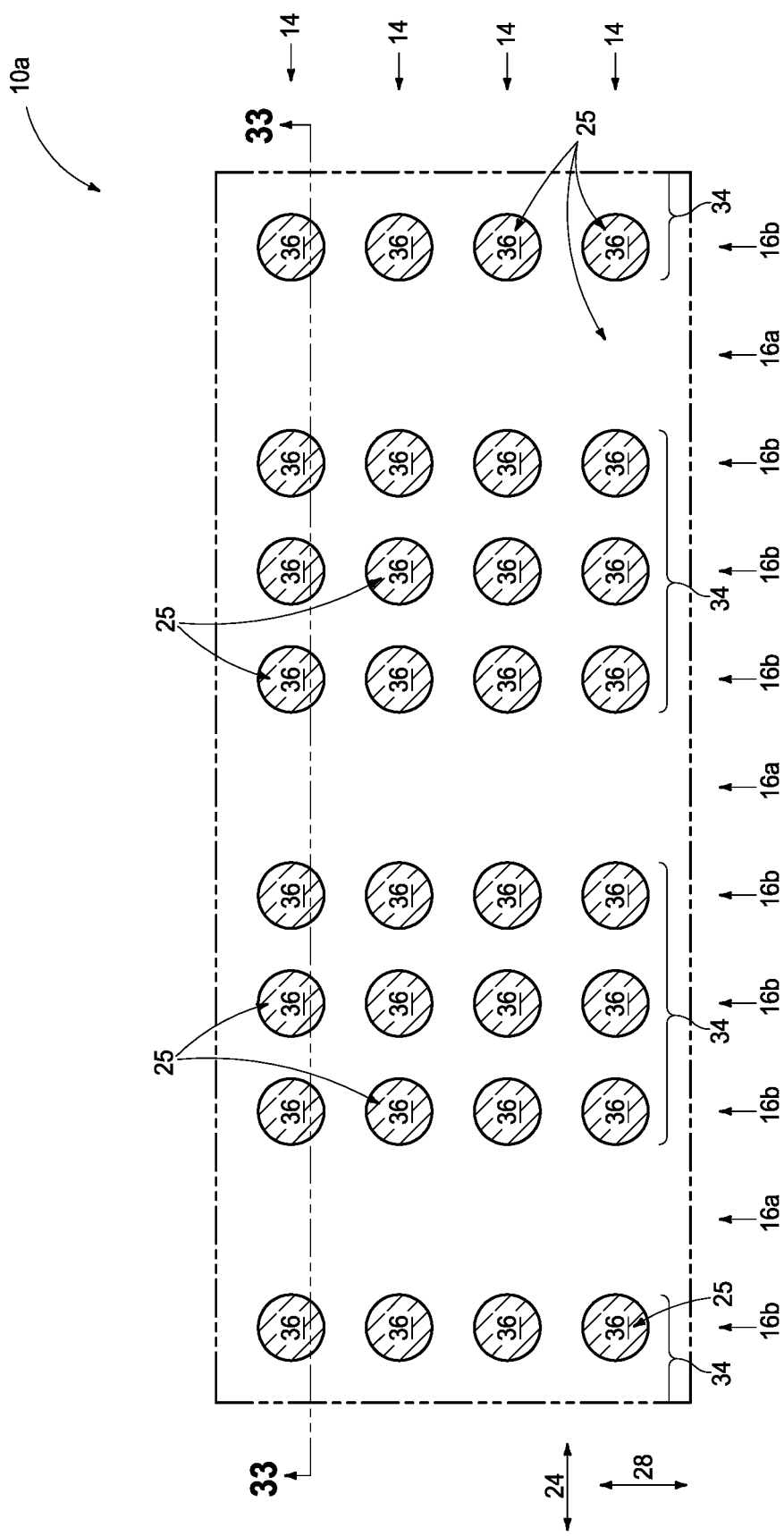
Figure 33:
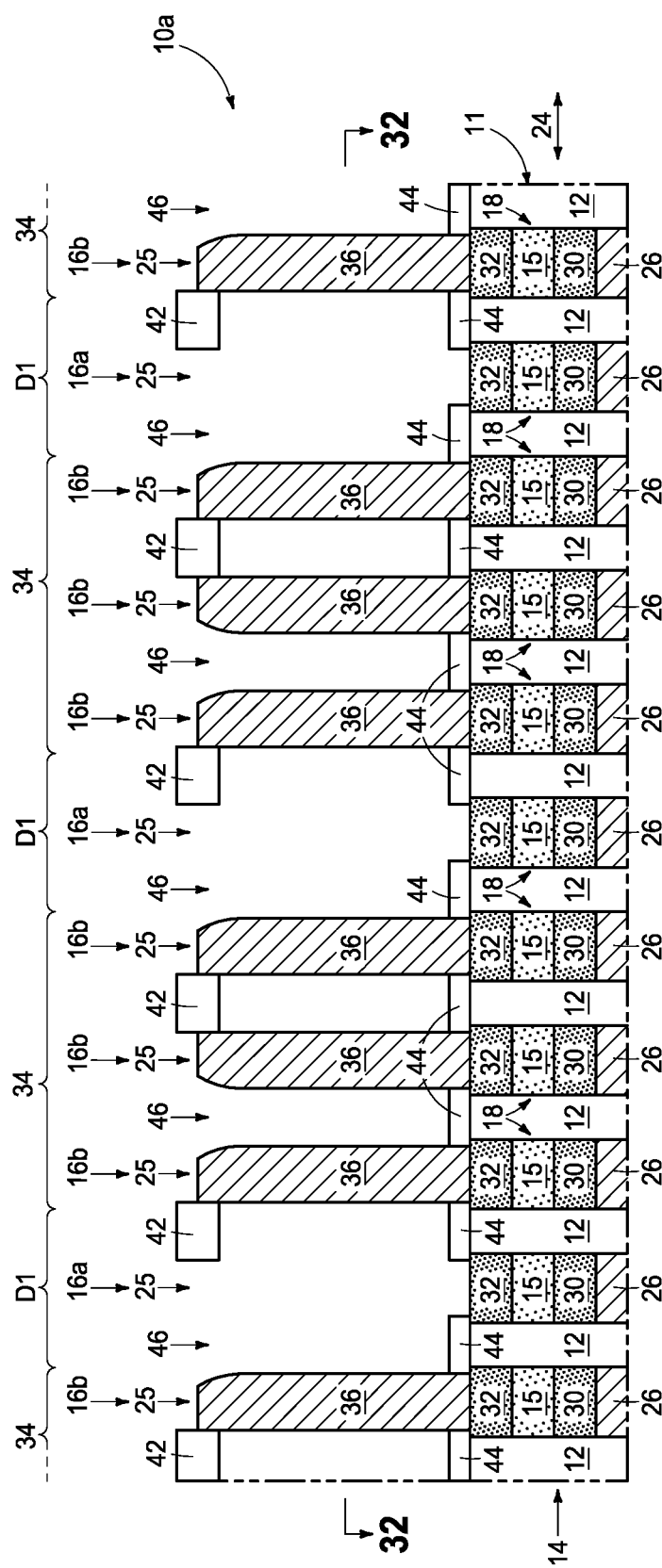

Referring to FIGS. 32 and 33, such show analogous processing to that of FIGS. 16 and 17 yet here where the act removing sacrificial material 40 (not shown) has also removed fill material 21 (not shown).

Figure 34:
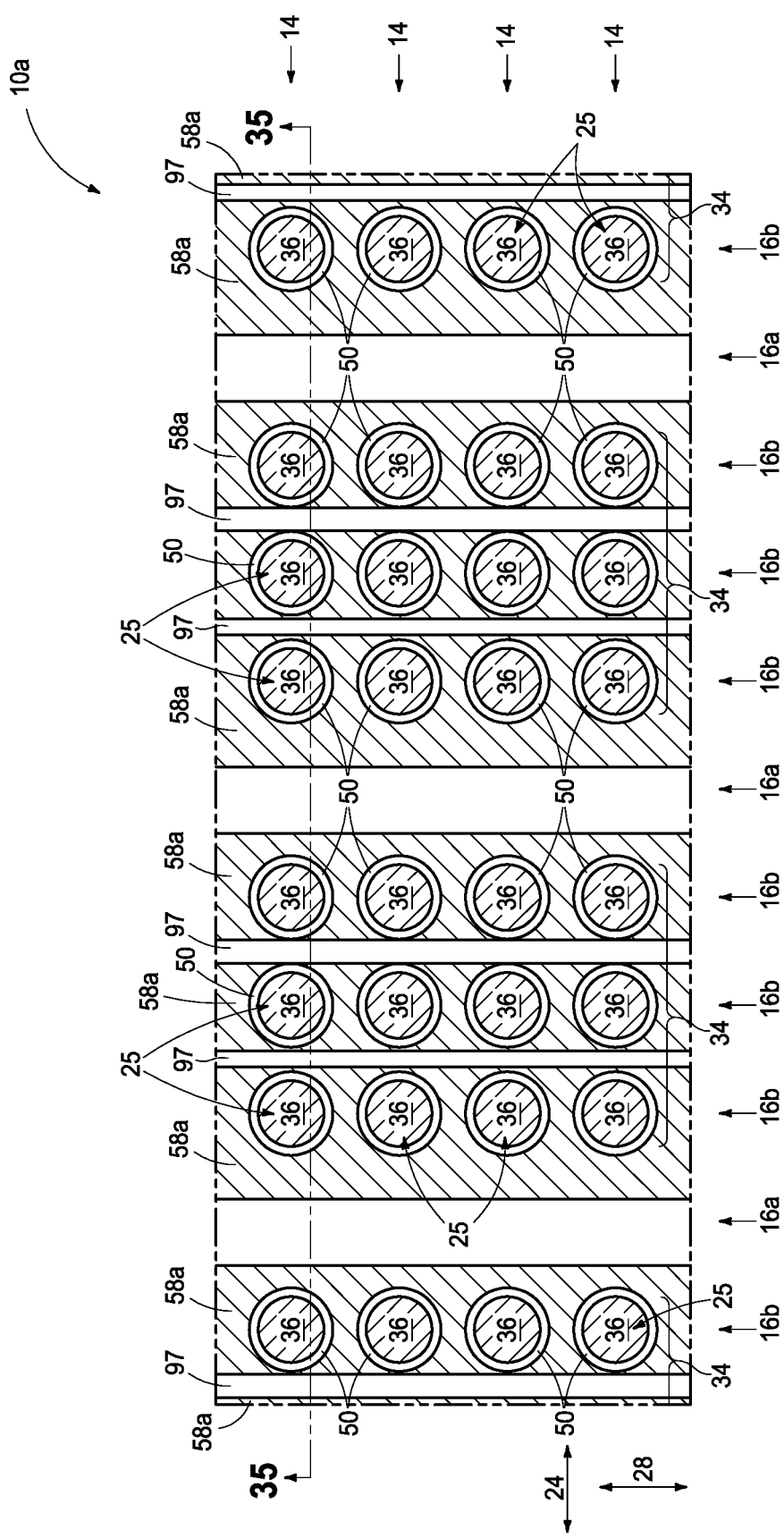
Figure 35:
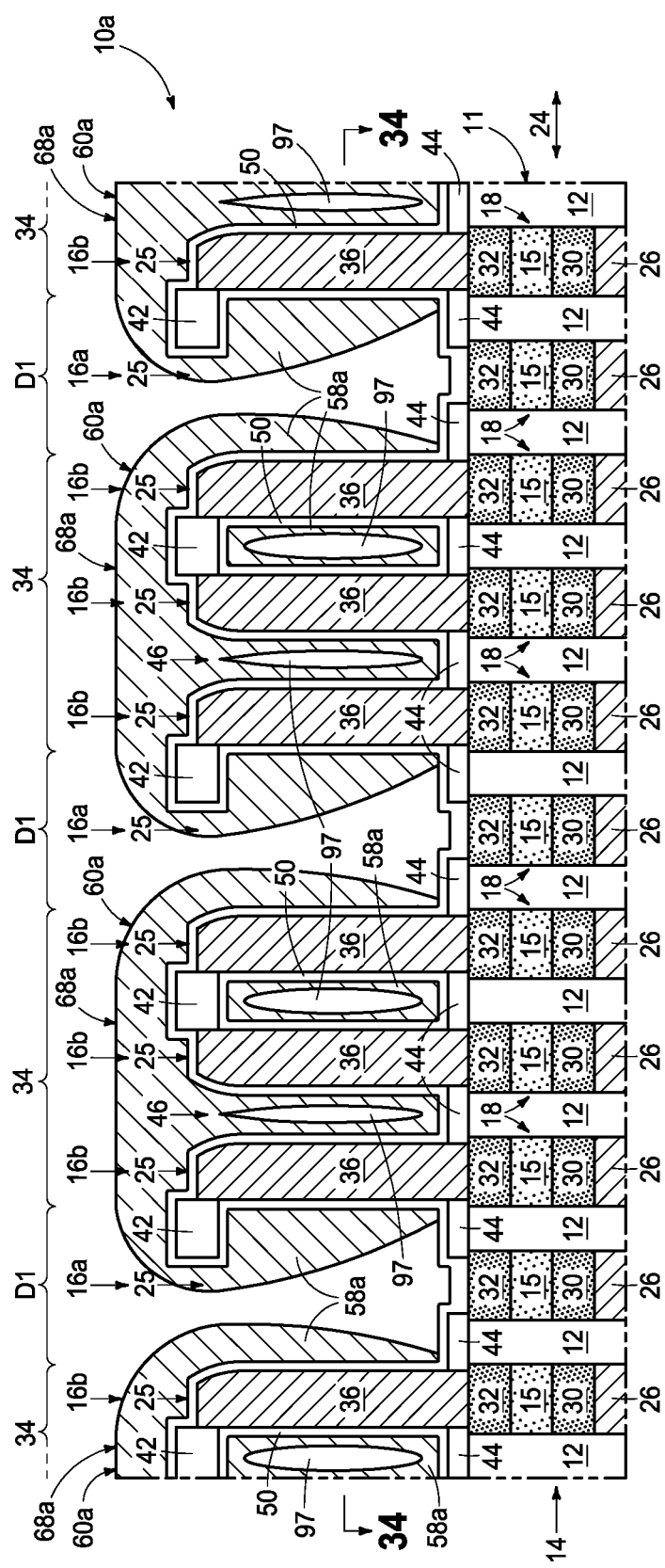

Referring to FIGS. 34 and 35, such show example alternate processing through that of FIGS. 22 and 23 of the above-described embodiment. Yet, here, and in one embodiment, upper capacitor electrode material 58a has been deposited in a somewhat non-conformal/low step-coverage manner (e.g., by physical vapor deposition) whereby material 58 is not laterally interconnected between immediately-adjacent groups 34, for example being essentially self-aligned in "x" but not in "y". Upper capacitor electrode material 58a could subsequently be patterned in "y" (e.g., by photolithographic patterning and subtractive anisotropic etch and not shown) to complete formation of upper capacitor electrodes 60a and conductive lines 68a. Void spaces 97 may be formed.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, an array (e.g., 90) of capacitors (e.g., 75) comprises a plurality of horizontally-spaced groups (e.g., 34) individually comprising a plurality of horizontally-spaced lower capacitor electrodes (e.g., 36). A capacitor insulator (e.g., 50) is over the lower capacitor electrodes. An upper capacitor electrode (e.g., 60) is common to all capacitors in individual of the groups. The capacitors in the individual groups individually comprise one of the lower capacitor electrodes, the capacitor insulator, and the common upper capacitor electrode in the respective individual group. A horizontally-elongated conductive line (e.g., 68) is atop and directly electrically coupled with the upper capacitor electrode in the individual groups (e.g., the line being a part of the upper capacitor electrode). Horizontally-spaced pillars (e.g., 23) are between immediately-adjacent of the individual groups. The pillars are circuit inoperative. Any other attribute(s) or aspect(s) as shown and/or described herein with respect to other embodiments may be used.

In one embodiment, an array (e.g., 94) of ferroelectric memory cells (e.g., 95) individually comprises a ferroelectric capacitor (e.g., 75) above a transistor (e.g., 18). Such an array comprises rows (e.g., 14) and columns (e.g., 16*; an * being used as a suffix to be inclusive of all such same-numerically-designated components that may or may not have other suffixes) of vertical transistors (e.g., 18). A gateline (e.g., 20) interconnects multiple of the transistors along individual of the rows in a row direction (e.g., 24). A digitline (e.g., 26) interconnects multiple of the transistors along individual of the columns in a column direction (e.g., 28). The transistors individually comprise a lower source/drain region (e.g., 30) directly electrically coupled with individual of the digitlines. The transistors individually comprise an upper source/drain region (e.g., 32). A plurality of horizontally-spaced groups (e.g., 34) individually comprise a plurality of horizontally-spaced lower capacitor electrodes (e.g., 36). Individual of the lower capacitor electrodes are directly above and directly electrically coupled to individual of the upper source/drain regions. Immediately adjacent of the groups are horizontally spaced apart from one another by a gap (e.g., across D1) that is horizontally elongated in the column direction. A ferroelectric capacitor insulator (e.g., 50) is over the lower capacitor electrodes. An upper capacitor electrode (e.g., 60) is common to all capacitors in individual of the groups. The capacitors (e.g., 75) in the individual groups individually comprise one of the lower capacitor electrodes, the capacitor insulator, and the common upper capacitor electrode in the respective individual group. A horizontally-elongated conductive line (e.g., 68) is atop and directly electrically coupled with the upper capacitor electrode in the individual groups. Horizontally-spaced pillars (e.g., 23) are in the gap between immediately-adjacent of the individual groups. The pillars are circuit inoperative. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/ conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Also, "self-aligned" or "self-aligning" means a technique whereby at least one pair of opposing edges of a structure is formed by a pair of previously-defined edges, thereby not requiring subsequent photolithographic processing with respect to those opposing edges.

Unless otherwise indicated, use of "or" herein encompasses either and both.

CONCLUSION

In some embodiments, a method of forming an array of capacitors comprises forming rows and columns of horizontally-spaced openings in a sacrificial material. Fill material is formed in multiple of the columns of the openings and lower capacitor electrodes a are formed in a plurality of the columns that are between the columns of the openings comprising the fill material therein. The fill material is of different composition from that of the lower capacitor electrodes. The fill material is between a plurality of horizontally-spaced groups that individually comprises the lower capacitor electrodes. Immediately-adjacent of the groups are horizontally spaced apart from one another by a gap that comprises at least one of the columns of the openings comprising the fill material therein. The sacrificial material is removed to expose laterally-outer sides of the lower capacitor electrodes. A capacitor insulator is formed over tops and the laterally-outer sides of the lower capacitor electrodes. Upper capacitor electrode material is formed over the capacitor insulator and the lower capacitor electrodes. A horizontally-elongated conductive line is formed atop individual of the groups that directly electrically couple together the upper capacitor electrode material there-below in that individual group.

In some embodiments, a method of forming an array of capacitors comprises forming rows and columns of horizontally-spaced openings in a substrate. Fill material is formed in multiple of the columns of the openings to form pillars in the multiple columns and lower capacitor electrodes are formed in a plurality of the columns that are between the pillars. The fill material is of different composition from that of the lower capacitor electrodes. The pillars are between a plurality of horizontally-spaced groups that individually comprise the lower capacitor electrodes. Immediately-adjacent of the groups are horizontally spaced apart from one another by a gap that comprises at least one of the columns of the pillars. A capacitor insulator is formed over the lower capacitor electrodes and the pillars. Upper capacitor electrode material is formed over the capacitor insulator, the lower capacitor electrodes, and the pillars. The upper capacitor electrode material extends across the gap and connects the upper capacitor electrode material that is in the immediately-adjacent groups. At least a portion of the upper capacitor electrode material is removed from the gap to disconnect the upper capacitor electrode material from being connected between the immediately-adjacent groups and a horizontally-elongated conductive line is formed atop individual of the groups that directly electrically couples together the upper capacitor electrode material there-below in that individual group.

In some embodiments, an array of capacitors comprises a plurality of horizontally-spaced groups that individually comprises a plurality of horizontally-spaced lower capacitor electrodes. A capacitor insulator is over the lower capacitor electrodes. An upper capacitor electrode is common to all capacitors in individual of the groups. The capacitors in the individual groups individually comprise one of the lower capacitor electrodes, the capacitor insulator, and the common upper capacitor electrode in the respective individual group. A horizontally-elongated conductive line is atop and directly electrically couples with the upper capacitor electrode in the individual groups. Horizontally-spaced pillars are between immediately-adjacent of the individual groups. The pillars are circuit inoperative.

In some embodiments, an array of ferroelectric memory cells individually comprising a ferroelectric capacitor above a transistor comprises rows and columns of vertical transistors. A gateline line interconnects multiple of the transistors along individual of the rows in a row direction. A digitline interconnects multiple of the transistors along individual of the columns in a column direction. The transistors individually comprise a lower source/drain region directly electrically coupled with individual of the digitlines. The transistors individually comprise an upper source/drain region. A plurality of horizontally-spaced groups individually comprise a plurality of horizontally-spaced lower capacitor electrodes. Individual of the lower capacitor electrodes is directly above and directly electrically coupled to individual of the upper source/drain regions. Immediately adjacent of the groups are horizontally spaced apart from one another by a gap that is horizontally elongated in the column direction. A ferroelectric capacitor insulator is over the lower capacitor electrodes. An upper capacitor electrode is common to all capacitors in individual of the groups. The capacitors in the individual groups individually comprise one of the lower capacitor electrodes, the capacitor insulator, and the common upper capacitor electrode in the respective individual group. A horizontally-elongated conductive line is atop and directly electrically couples with the upper capacitor electrode in the individual groups. Horizontally-spaced pillars in the gap are between immediately-adjacent of the individual groups. The pillars are circuit inoperative.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of capacitors, comprising:
    forming rows and columns of horizontally-spaced openings in a sacrificial material;
    forming fill material in multiple of the columns of the openings with a remainder of the openings being free of the fill material, the fill material entirely filling the openings comprised by the multiple of the columns of the openings;
    forming lower capacitor electrodes in a plurality of the columns that are between the columns of the openings comprising the fill material therein, the fill material being of different composition from that of the lower capacitor electrodes, the fill material being between a plurality of horizontally-spaced groups individually comprising the lower capacitor electrodes, immediately-adjacent of the groups being horizontally spaced apart from one another by a gap that comprises at least one of the columns of the openings comprising the fill material therein;
    removing the sacrificial material to expose laterally-outer sides of the lower capacitor electrodes;
    forming a capacitor insulator over tops and the laterally-outer sides of the lower capacitor electrodes;
    forming upper capacitor electrode material over the capacitor insulator and the lower capacitor electrodes; and
    forming a horizontally-elongated conductive line atop individual of the groups that directly electrically couples together the upper capacitor electrode material there-below in that individual group.

2. The method of claim 1 wherein the fill material is formed before the lower capacitor electrodes are formed.

3. The method of claim 1 wherein the fill material comprises a different composition from that of the sacrificial material.

4. The method of claim 3 wherein the removing the sacrificial material is conducted selectively relative to the fill material.

5. The method of claim 4 wherein the fill material remains in a finished construction.

6. The method of claim 1 wherein the fill material and the sacrificial material are of the same composition relative one another, the act of removing the sacrificial material also removing the fill material.

7. The method of claim 1 wherein the capacitor insulator is ferroelectric.

8. The method of claim 1 comprising forming a plurality of transistors that individually directly electrically couple to individual of the lower capacitor electrodes.

9. The method of claim 8 wherein the transistors are vertical transistors.

10. A method of forming an array of capacitors, comprising:
    forming rows and columns of horizontally-spaced openings in a substrate;
    forming fill material in multiple of the columns of the openings to form pillars of the fill material that entirely fill the openings in the multiple columns and forming lower capacitor electrodes in a plurality of the columns that are between the pillars, the fill material being of different composition from that of the lower capacitor electrodes, the pillars being between a plurality of horizontally-spaced groups individually comprising the lower capacitor electrodes, immediately-adjacent of the groups being horizontally spaced apart from one another by a gap that comprises at least one of the columns of the pillars;
    forming a capacitor insulator over the lower capacitor electrodes and the pillars;
    forming upper capacitor electrode material over the capacitor insulator, the lower capacitor electrodes, and the pillars; the upper capacitor electrode material extending across the gap and connecting the upper capacitor electrode material that is in the immediately-adjacent groups; and
    removing at least a portion of the upper capacitor electrode material from the gap to disconnect the upper capacitor electrode material from being connected between the immediately-adjacent groups and forming a horizontally-elongated conductive line atop individual of the groups that directly electrically couples together the upper capacitor electrode material there-below in that individual group.

11. The method of claim 10 wherein the immediately-adjacent groups are horizontally spaced farther apart than are closest-immediately-adjacent of the lower capacitor electrodes within the groups.

12. The method of claim 10 wherein the openings are formed in a sacrificial material that comprises a different composition from that of the fill material, and further comprising:
    removing the sacrificial material to expose laterally-outer sides of the lower capacitor electrodes, the capacitor insulator and the upper capacitor electrode material being formed over the laterally-outer sides of the lower capacitor electrodes.

13. The method of claim 10 wherein the capacitor insulator is ferroelectric.

14. The method of claim 10 comprising forming a plurality of transistors that individually directly electrically couple to individual of the lower capacitor electrodes.

15. The method of claim 14 wherein the transistors are vertical transistors.

* * * * *